US012771386B2

(12) United States Patent
Pehlke

(10) Patent No.: US 12,771,386 B2
(45) Date of Patent: Oct. 20, 2026

(54) CONSOLIDATION OF AMPLIFIER RAMPING FOR 2G AND 5G TRANSMISSION

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 285 days.

(21) Appl. No.: 18/398,020

(22) Filed: Dec. 27, 2023

(65) Prior Publication Data

US 2024/0223227 A1 Jul. 4, 2024

Related U.S. Application Data

(60) Provisional application No. 63/435,753, filed on Dec. 28, 2022.

(51) Int. Cl.

*H04B 1/04* (2006.01)
*H03F 3/21* (2006.01)
*H03F 3/24* (2006.01)
*H03G 3/30* (2006.01)

(52) U.S. Cl.

CPC .......... *H04B 1/0458* (2013.01); *H03F 3/211* (2013.01); *H03F 3/24* (2013.01); *H03G 3/3047* (2013.01); *H04B 2001/0408* (2013.01)

(58) Field of Classification Search

CPC .......... H04B 1/0458; H04B 2001/0408; H03F 3/211; H03F 3/24; H03F 3/19; H03F 3/245; H03G 3/3047

See application file for complete search history.

(56) References Cited

U.S. PATENT DOCUMENTS

| | | | | |
|---|---|---|---|---|
| 7,679,433 | B1 * | 3/2010 | Li | H03F 1/0266 330/297 |
| 9,344,140 | B2 | 5/2016 | Reisner et al. | |
| 9,628,134 | B2 | 4/2017 | Reisner et al. | |
| 9,837,972 | B2 | 12/2017 | Arkiszewski et al. | |
| 10,033,423 | B2 | 7/2018 | Reisner et al. | |
| 10,110,184 | B2 | 10/2018 | Lyalin et al. | |
| 10,135,339 | B1 * | 11/2018 | Rosenbaum | H03F 3/245 |
| 10,153,736 | B2 | 12/2018 | King et al. | |
| 10,177,838 | B2 | 1/2019 | Ripley | |
| 10,411,662 | B2 | 9/2019 | Lyalin et al. | |
| 10,418,900 | B2 | 9/2019 | Ripley | |
| 10,554,294 | B2 | 2/2020 | Ripley | |
| 10,560,139 | B2 | 2/2020 | Brunel et al. | |
| 10,840,810 | B2 | 11/2020 | Ripley | |
| 10,840,856 | B2 | 11/2020 | Ng et al. | |
| 10,855,233 | B2 | 12/2020 | Ng et al. | |
| 10,944,367 | B2 | 3/2021 | Lyalin et al. | |
| 11,323,073 | B2 | 5/2022 | King et al. | |
| 11,323,077 | B2 | 5/2022 | Ng et al. | |
| 11,387,532 | B2 | 7/2022 | Cruickshank et al. | |

(Continued)

*Primary Examiner* — Fayyaz Alam
(74) *Attorney, Agent, or Firm* — VIA LLP

(57) ABSTRACT

A radio frequency front end system includes a power amplifier and a variable driver stage coupled to the power amplifier. The variable driver stage applies a ramp profile to the power amplifier according to a $V_{ramp}$ control signal and is configured to apply a linear ramp by setting a gain to a fixed target value.

20 Claims, 22 Drawing Sheets

(56) References Cited

U.S. PATENT DOCUMENTS

| | | | | |
|---|---|---|---|---|
| 11,476,806 | B2 | 10/2022 | Ng et al. | |
| 11,581,857 | B2 | 2/2023 | Ng et al. | |
| 11,804,642 | B2 | 10/2023 | Cruickshank et al. | |
| 2005/0130617 | A1* | 6/2005 | Burns | H03F 1/26 348/E7.052 |
| 2010/0231305 | A1* | 9/2010 | Mizokami | H03F 3/45179 330/277 |
| 2013/0043953 | A1* | 2/2013 | Spiegel | H03F 1/0261 330/297 |
| 2014/0300426 | A1* | 10/2014 | Mu | H04B 1/0475 332/103 |
| 2016/0190995 | A1 | 6/2016 | Penticoff | |
| 2017/0141734 | A1* | 5/2017 | Lehtola | H03F 1/0261 |
| 2018/0166763 | A1 | 6/2018 | Cruickshank et al. | |
| 2018/0375479 | A1* | 12/2018 | Bai | H04B 1/04 |
| 2019/0140604 | A1* | 5/2019 | Ushikubo | H03F 3/19 |
| 2022/0217028 | A1 | 7/2022 | Pehlke | |
| 2022/0311469 | A1 | 9/2022 | Brunel et al. | |
| 2023/0318568 | A1 | 10/2023 | Ta et al. | |
| 2024/0056106 | A1 | 2/2024 | Arkiszewski et al. | |
| 2024/0128627 | A1 | 4/2024 | Cruickshank et al. | |
| 2024/0204975 | A1 | 6/2024 | Pehlke | |
| 2024/0223227 | A1 | 7/2024 | Pehlke | |

* cited by examiner

200

121
122
123
124
204
205
206
207
208
209
210
211
212
213
RFIC
203
PMU
201
PMU
202
UHB PAiD
221
HB PAiD
225
MB PAiD
226
2G PAM
232
LB PAiD
227
UL CA + MIMO
228
UHB PAiD
222
UHB PAiD
223
MB/HB/
MIMO DRx
229
UHB PAiD
224
UHB/
MB/HB DRx
230
LB DRx
231
241
242
243
244
245
246
247
248
249
250
251
252
253
254
255
256
257
258
259
260
261
262
263
264
265
266
267
271
272
273
274
275
276
277

CONSOLIDATION OF AMPLIFIER RAMPING FOR 2G AND 5G TRANSMISSION

BACKGROUND

Any and all applications for which a foreign or domestic priority claim is identified in the Application Data Sheet as filed with the present application are hereby incorporated by reference under 37 CFR 1.57.

FIELD

Embodiments of the invention relate to electronic systems, and in particular, to radio frequency (RF) electronics supporting 2G and 5G transmission.

DESCRIPTION OF THE RELATED TECHNOLOGY

RF communication systems can be used for transmission (Tx) and/or reception (Rx) of RF signals over a wide range of frequencies. For example, a RF communication system can be used to wirelessly communicate RF signals in a frequency range of about 30 kHz to 300 GHz, such as in the range of about 450 MHz to about 7.125 GHz for certain communications standards, e.g., Fifth Generation (5G) cellular communications.

Examples of RF communication systems include, but are not limited to, mobile phones, tablets, base stations, network access points, customer-premises equipment (CPE), laptops, and wearable electronics.

RF communication systems implement dedicated designs for Second Generation (2G), Third Generation (3G), Fourth Generation (4G), Fifth Generation (5G), etc. cellular communications.

Conventional user equipment implementation of a 2G transmitter is split across two fundamental approaches. The first is where a transceiver performs a time division duplex (TDD) ramping (strict power vs. time mask to meet both GMSK and 8 PSK) and the power amplifier that follows is a fixed gain/linear power amplifier (PA) which takes the drive power ramping and simply amplifies it. The second approach is based on a fixed (close to maximum) drive power from the transceiver, and the PA is saturated and applies a ramp as a function of a control signal, "$V_{ramp}$" also coming from the transceiver. This ramp can be reconstructed at the PA using one of the following sub-methods: 1) $V_{ramp}$ is applied to a variable LDO that dissipatively drops a VCC voltage and varies the VCC, or 2) $V_{ramp}$ is directly applied to the base bias of the PA, and a closed-loop lock of the ICC current with the $V_{ramp}$ assures the output power ramps according to $V_{ramp}$.

One of the challenges is how to design a PA that consolidates these various methods to be able to support 2G ramping across different platforms that may support 2G differently, using a single/consolidated PA with a new design approach that can support all methods of 2G ramping in RF communication systems of any generation.

SUMMARY OF CERTAIN INVENTIVE CONCEPTS

The systems, methods and devices of this disclosure each have several aspects, no single one of which is solely responsible for the desirable attributes disclosed herein.

In some aspects, the techniques described herein relate to a radio frequency front end system including: a power amplifier; and a variable driver stage coupled to the power amplifier, the variable driver stage configured to apply a ramp profile to the power amplifier according to a Vramp control signal, and configured to apply a linear ramp by setting a gain to a fixed target value.

In some aspects, the techniques described herein relate to a radio frequency front end system wherein the variable driver stage is configured to detect an envelope of the Vramp control signal to set the ramp profile.

In some aspects, the techniques described herein relate to a radio frequency front end system wherein the variable driver stage includes a switch configured to receive the Vramp control signal directly from a transceiver.

In some aspects, the techniques described herein relate to a radio frequency front end system wherein the variable driver stage further includes a variable attenuator configured to receive the Vramp control signal directly from the switch.

In some aspects, the techniques described herein relate to a radio frequency front end system wherein the variable driver stage includes a variable attenuator configured to establish the ramp profile at the power amplifier.

In some aspects, the techniques described herein relate to a radio frequency front end system wherein the variable driver stage is configured to bypass the variable attenuator to directly amplify with the power amplifier for second generation (2G) cellular communications.

In some aspects, the techniques described herein relate to a radio frequency front end system wherein the variable driver stage includes a driver amplifier configured to reconstruct the ramp profile from VCC variation.

In some aspects, the techniques described herein relate to a radio frequency front end system wherein the variable driver stage includes a fixed attenuator coupled between the driver amplifier and the power amplifier.

In some aspects, the techniques described herein relate to a radio frequency front end system wherein the variable driver stage is configured to apply the ramp profile to the power amplifier according to the Vramp control signal, and configured to apply the linear ramp by setting the gain to the fixed target value, without envelope detection.

In some aspects, the techniques described herein relate to a radio frequency front end system wherein the variable driver stage includes a driver amplifier coupled between an input pin for 2G cellular communications and the power amplifier.

In some aspects, the techniques described herein relate to a radio frequency front end system wherein the variable driver stage includes a switch amplifier coupled to an output of the driver amplifier, an input pin for 4G or 5G cellular communications, and the power amplifier.

In some aspects, the techniques described herein relate to a radio frequency front end system wherein the variable driver stage includes a voltage variable attenuator, a driver amplifier, and a pre-power amplifier attenuator.

In some aspects, the techniques described herein relate to a radio frequency front end system wherein the power amplifier is a low-band (LB) power amplifier for 4G or 5G cellular communications.

In some aspects, the techniques described herein relate to a radio frequency front end system wherein the power amplifier is a mid-band (MB) power amplifier for 4G or 5G cellular communications.

In some aspects, the techniques described herein relate to a radio frequency front end system further including: a mid-band power amplifier for 4G or 5G cellular communications; and a variable driver stage coupled to the mid-band power amplifier, the variable driver stage being coupled to the mid-band power amplifier configured to apply a ramp profile to the mid-band power amplifier according to a Vramp control signal, and configured to apply a linear ramp by setting a gain to a fixed target value.

In some aspects, the techniques described herein relate to a wireless device including a transceiver, and a radio frequency front end system, the radio frequency front end system including: a power amplifier; and a variable driver stage coupled to the power amplifier, the variable driver stage being configured to apply a ramp profile to the power amplifier according to a Vramp control signal, and configured to apply a linear ramp by setting a gain to a fixed target value.

In some aspects, the techniques described herein relate to a wireless device wherein the variable driver stage is configured to detect an envelope of the Vramp control signal to set the ramp profile.

In some aspects, the techniques described herein relate to a wireless device wherein the variable driver stage includes a switch configured to receive the Vramp control signal directly from the transceiver.

In some aspects, the techniques described herein relate to a wireless device wherein the variable driver stage further includes a variable attenuator configured to receive the Vramp control signal directly from the switch.

In some aspects, the techniques described herein relate to a wireless device wherein the variable driver stage includes a variable attenuator configured to establish the ramp profile at the power amplifier.

In some aspects, the techniques described herein relate to a wireless device wherein the variable driver stage is configured to bypass the variable attenuator to directly amplify with the power amplifier for second generation (2G) cellular communications.

In some aspects, the techniques described herein relate to a wireless device wherein the variable driver stage includes a driver amplifier configured to reconstruct the ramp profile from VCC variation.

In some aspects, the techniques described herein relate to a wireless device wherein the variable driver stage further includes a fixed attenuator coupled between the driver amplifier and the power amplifier.

In some aspects, the techniques described herein relate to a wireless device wherein the variable driver stage is configured to apply the ramp profile to the power amplifier according to the Vramp control signal, and configured to apply the linear ramp by setting the gain to the fixed target value, without envelope detection.

In some aspects, the techniques described herein relate to a wireless device wherein the variable driver stage includes a driver amplifier coupled between an input pin for 2G cellular communications and the power amplifier.

In some aspects, the techniques described herein relate to a wireless device wherein the variable driver stage further includes a switch amplifier coupled to an output of the driver amplifier, an input pin for 4G or 5G cellular communications, and the power amplifier.

In some aspects, the techniques described herein relate to a wireless device wherein the variable driver stage includes a voltage variable attenuator, a driver amplifier, and a pre-power amplifier attenuator.

In some aspects, the techniques described herein relate to a wireless device wherein the power amplifier is a low-band (LB) power amplifier for 4G or 5G cellular communications.

In some aspects, the techniques described herein relate to a wireless device wherein the power amplifier is a mid-band (MB) power amplifier for 4G or 5G cellular communications.

In some aspects, the techniques described herein relate to a radio frequency front end system further including: a mid-band power amplifier for 4G or 5G cellular communications; and a variable driver stage coupled to the mid-band power amplifier, the variable driver stage being coupled to the mid-band power amplifier configured to apply a ramp profile to the mid-band power amplifier according to a Vramp control signal, and configured to apply a linear ramp by setting a gain to a fixed target value.

DETAILED DESCRIPTION OF EMBODIMENTS

Figure 1:
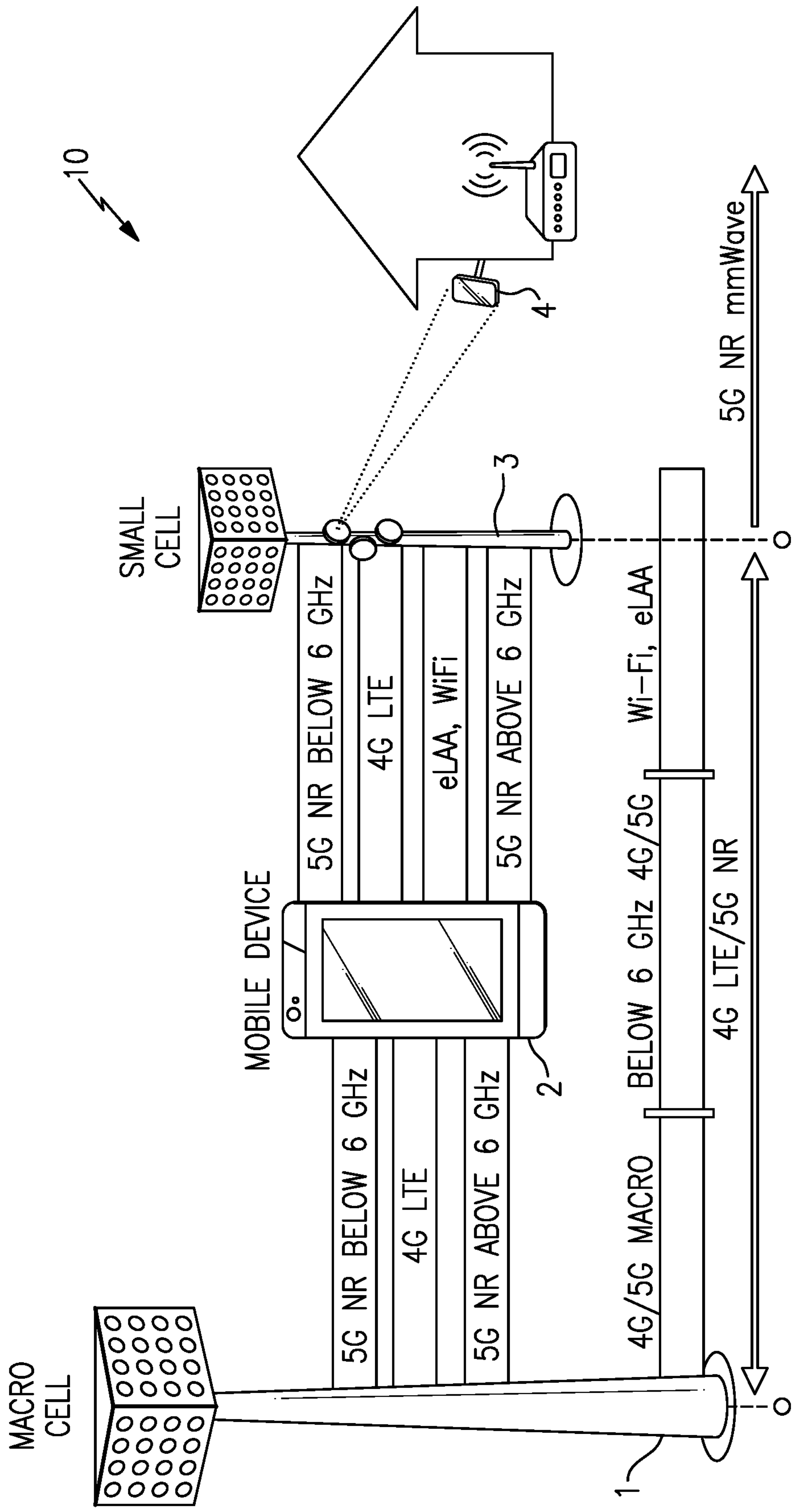
FIG. 1 is a diagram of an example dual connectivity network topology.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and developed 5G technology further in Release 16. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Communication Network

FIG. 1 is a schematic diagram of one example of a communication network 10. The communication network 10 includes a macro cell base station 1, a mobile device 2, a small cell base station 3, and a stationary wireless device 4.

The illustrated communication network 10 of FIG. 1 supports communications using a variety of technologies, including, for example, 4G LTE, 5G NR, and wireless local area network (WLAN), such as Wi-Fi. In the communication network 10, dual connectivity can be implemented with concurrent 4G LTE and 5G NR communication with the mobile device 2. Although various examples of supported communication technologies are shown, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 1, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 2 and the small cell base station 3 using 5G NR technology over one or more frequency bands that are less than 6 Gigahertz (GHz) and/or over one or more frequency bands that are greater than 6 GHz. In certain implementations, the mobile device 2 communicates with the macro cell base station 2 and the small cell base station 3 using 5G NR technology over one or more frequency bands that are less than 7.5 Gigahertz (GHz) and/or over one or more frequency bands that are greater than 7.5 GHz. For example, wireless communications can utilize Frequency Range 1 (FR1), Frequency Range 2 (FR2), or a combination thereof. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 10 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 10 is illustrated as including two base stations, the communication network 10 can be implemented to include more or fewer base stations and/or base stations of other types. As shown in FIG. 1, base stations can communicate with one another using wireless communications to provide a wireless backhaul. Additionally or alternatively, base stations can communicate with one another using wired and/or optical links.

The communication network 10 of FIG. 1 is illustrated as including one mobile device and one stationary wireless device. The mobile device 2 and the stationary wireless device 4 illustrate two examples of user devices or user equipment (UE). Although the communication network 10 is illustrated as including two user devices, the communication network 10 can be used to communicate with more or fewer user devices and/or user devices of other types. For example, user devices can include mobile phones, tablets, laptops, IoT devices, wearable electronics, and/or a wide variety of other communications devices.

User devices of the communication network 10 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDM is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IOT) applications.

The communication network 10 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to M*B*log 2(1+S/N), where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Carrier Aggregation

Figure 2A:
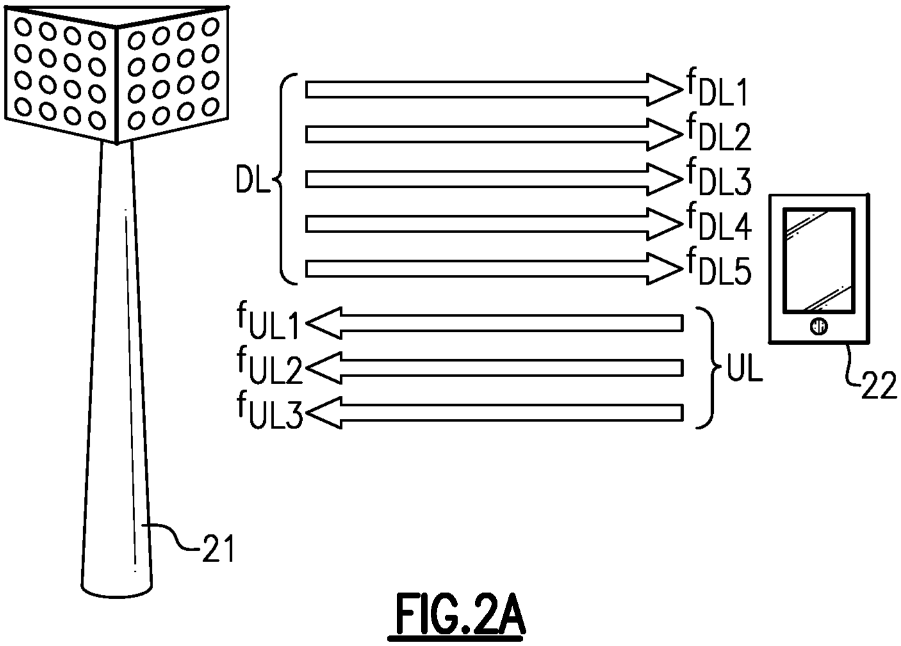
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers fUL1, fUL2, and fUL3. Additionally, the downlink channel includes five aggregated component carriers fDL1, fDL2, fDL3, fDL4, and fDL5. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
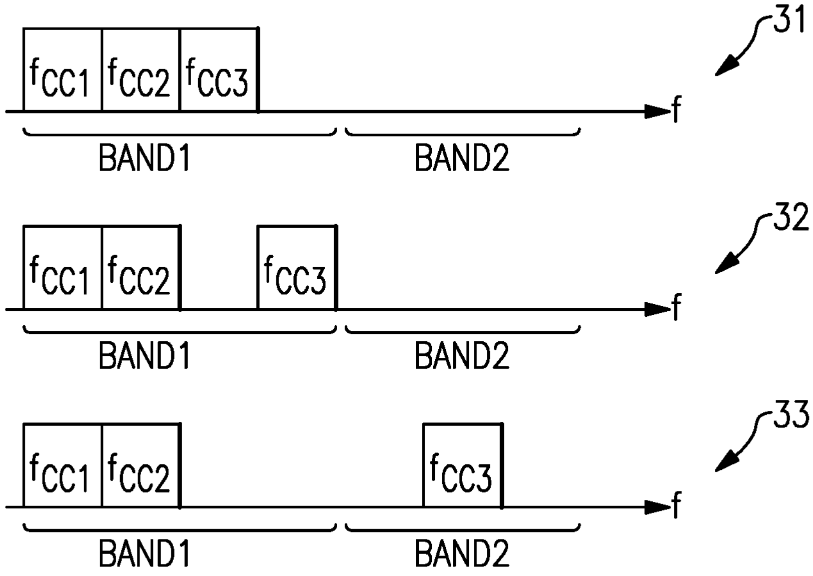
FIG. 2B illustrates various examples of carrier aggregation for the communication link of FIG. 2A.

FIG. 2B illustrates various examples of carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier fcc1, a second component carrier fcc2, and a third component carrier fcc3. Although FIG. 2B is illustrated in the context of aggregating three component carriers, carrier aggregation can be used to aggregate more or fewer carriers.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers fcc1, fcc2, and fcc3 that are contiguous and located within a first frequency band BAND1.

With continuing reference to FIG. 2B, the second carrier aggregation scenario 32 illustrates intra-band non-contiguous carrier aggregation, in which two or more components carriers that are non-adjacent in frequency and within a common frequency band are aggregated. For example, the second carrier aggregation scenario 32 depicts aggregation of component carriers fcc1, fcc2, and fcc3 that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers fcc1 and fcc2 of a first frequency band BAND1 with component carrier fcc3 of a second frequency band BAND2.

With reference to FIGS. 2A and 2B, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as Wi-Fi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid Wi-Fi users and/or to coexist with Wi-Fi users. Enhanced license assisted access (eLAA) refers to an evolution of LAA that aggregates licensed and unlicensed spectrum for both downlink and uplink.

Multi-Input and Multi-Output (MIMO) Communications

Figure 3A:
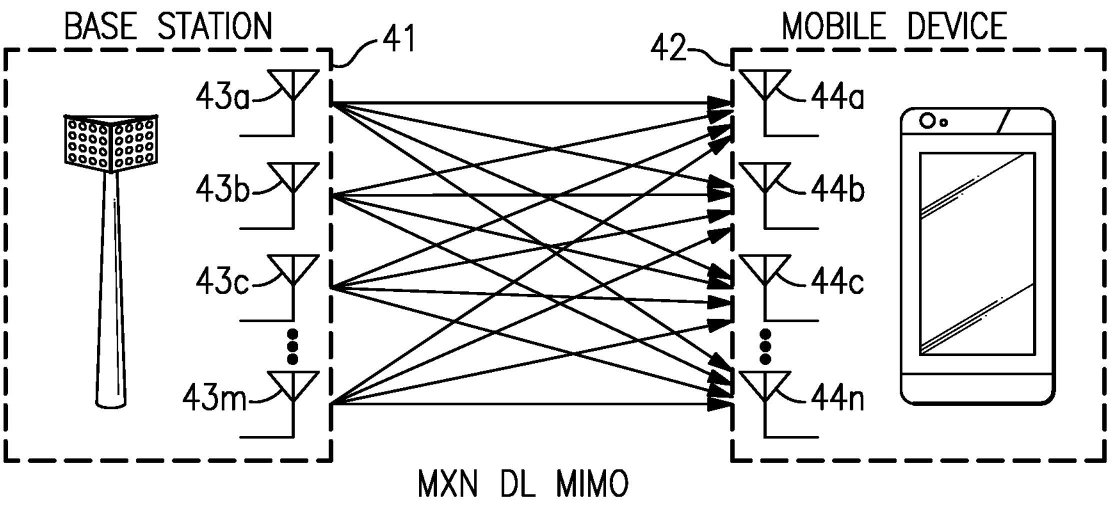
FIG. 3A is a schematic diagram of one example of a downlink channel using multi-input and multi-output (MIMO) communications.
Figure 3B:
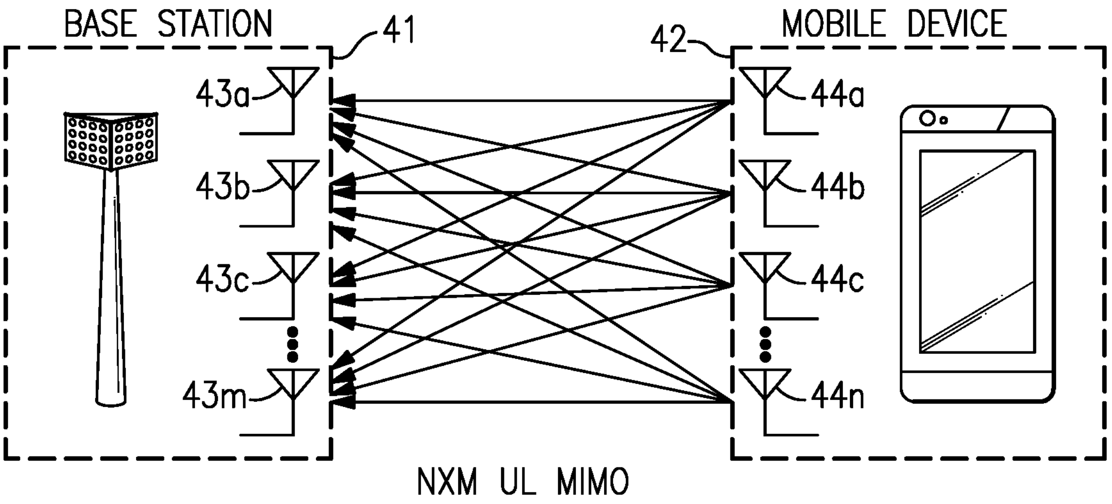
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of N×M UL MIMO.

By increasing the level or order of MIMO, bandwidth of an uplink channel and/or a downlink channel can be increased.

MIMO communications are applicable to dual connectivity and to communication links of a variety of types, such as FDD communication links and TDD communication links.

Examples of Radio Frequency Electronics

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals.

Additionally, RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHZ, also referred to herein as MB), one or more high bands (for example, RF signal bands having a frequency content between 2.3 GHz and 3 GHZ, also referred to herein as HB), and one or more ultrahigh bands (for example, RF signal bands having a frequency content between 3 GHz and 8 GHZ, also referred to herein as UHB).

RFFE systems can be used in a wide variety of RF communication devices, including, but not limited to, smartphones, base stations, laptops, handsets, wearable electronics, and/or tablets.

A RFFE system can be implemented to support a variety of features that enhance bandwidth and/or other performance characteristics of the RF communication device in which the RFFE system is incorporated.

In one example, a RFFE system is implemented to support carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

In another example, a RFFE system is implemented to support multi-input and multi-output (MIMO) communications to increase throughput and enhance mobile broadband service. MIMO communications use multiple antennas for communicating multiple data streams over a single radio frequency channel. MIMO communications benefit from higher signal to noise ratio, improved coding, and/or reduced signal interference due to spatial multiplexing differences of the radio environment.

MIMO order refers to a number of separate data streams sent or received. For instance, a MIMO order for downlink communications can be described by a number of transmit antennas of a base station and a number of receive antennas for user equipment (UE), such as a mobile device.

RFFE systems that support carrier aggregation and multi-order MIMO can be used in RF communication devices that operate with wide bandwidth. For example, such RFFE systems can be used in applications servicing multimedia content streaming at high data rates.

Fifth Generation (5G) technology seeks to achieve high peak data rates above 10 Gbps. Certain 5G high-speed communications can be referred to herein as Enhanced Multi-user Broadband (eMBB).

To achieve eMBB data rates, RF spectrum available at millimeter wave frequencies (for instance, 30 GHz and higher) is attractive, but significant technical hurdles are present in managing the loss, signal conditioning, radiative phased array aspects of performance, beam tracking, test, and/or packaging in the handset associated with millimeter wave communications.

The RFFE systems herein can operate using not only LB, MB, and HB frequencies, but also ultrahigh band (UHB) frequencies in the range of about 3 GHz to about 6 GHz and even 8 GHZ, and more particular between about 3.4 GHz and about 3.8 GHz. By communicating using UHB, enhanced peak data rates can be achieved without the technical hurdles associated with millimeter wave communications.

In certain implementations herein, UHB transmit and receive modules are employed for both transmission and reception of UHB signals via at least two primary antennas and at least two diversity antennas, thereby providing both 4×4 RX MIMO and 4×4 TX MIMO with respect to one or more UHB frequency bands, such as Band 42 (about 3.4 GHz to about 3.6 GHZ), Band 43 (about 3.6 GHz to about 3.8 GHZ), and/or Band 48 (about 3.55 GHz to about 3.7 GHZ). Furthermore, in certain configurations, the RFFE systems herein employ carrier aggregation using one or more UHB carrier frequencies, thereby providing flexibility to widen bandwidth for uplink and/or downlink communications.

By enabling high-order MIMO and/or carrier aggregation features using UHB spectrum, enhanced data rates can be achieved. Additionally, rather than using dedicated 5G antennas and a separate transceiver, shared antennas and/or a shared transceiver (for example, a semiconductor die including a shared transceiver fabricated thereon) can be used for both 5G UHB communications and 4G/LTE communications associated with HB, MB, and/or LB. Thus, 4G/LTE communications systems can be extended to support sub-6 GHz 5G capabilities with a relatively small impact to system size and/or cost.

Figure 4A:
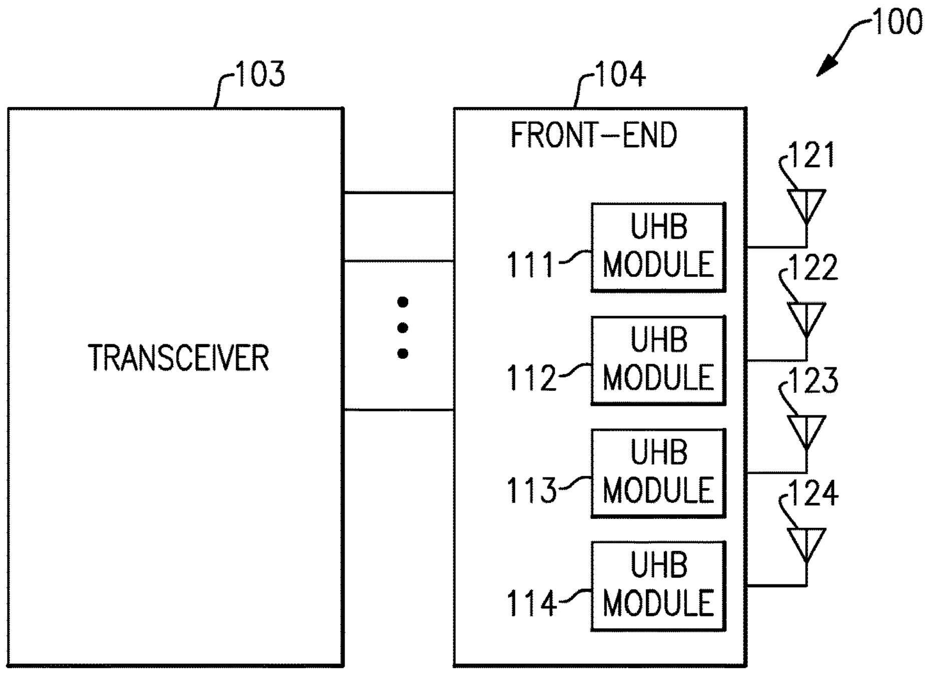
FIG. 4A is a schematic diagram of an exemplary radio frequency (RF) system.

FIG. 4A is a schematic diagram of a RF system 100. The RF system 100 includes a radio frequency integrated circuit (RFIC) or transceiver 103, a front-end system 104 and antennas 121-124. In certain implementations, the antenna 121 is a first primary antenna, the antenna 122 is a second primary antenna, the antenna 123 is a first diversity antenna, and the antenna 124 is a second diversity antenna.

Although the RF system 100 is depicted as including certain components, other implementations are possible, including, but not limited to, implementations using other numbers of antennas, different implementations of components, and/or additional components.

The front-end system 104 includes a first UHB module 111, a second UHB module 112, a third UHB module 113, and a fourth UHB module 114. The front-end system 104 further includes separate antenna terminals for coupling to each of the antennas 121-124.

Thus, the front-end system 104 of FIG. 4A includes multiple UHB modules for supporting communications of UHB signals across multiple antennas. For example, in certain implementations, the UHB modules 111-114 are configured to transmit and receive UHB signals via the antennas 121-124, respectively. Accordingly, broadband communications via UHB frequency carriers can be achieved.

For clarity of the figures, the front end system 104 is depicted as including only the UHB modules 111-114. However, the front end system 104 typically includes additionally components and circuits, for example, modules associated with LB, MB, and/or HB cellular communications. Furthermore, modules can be included for Wi-Fi, Bluetooth, and/or other non-cellular communications.

Figure 4B:
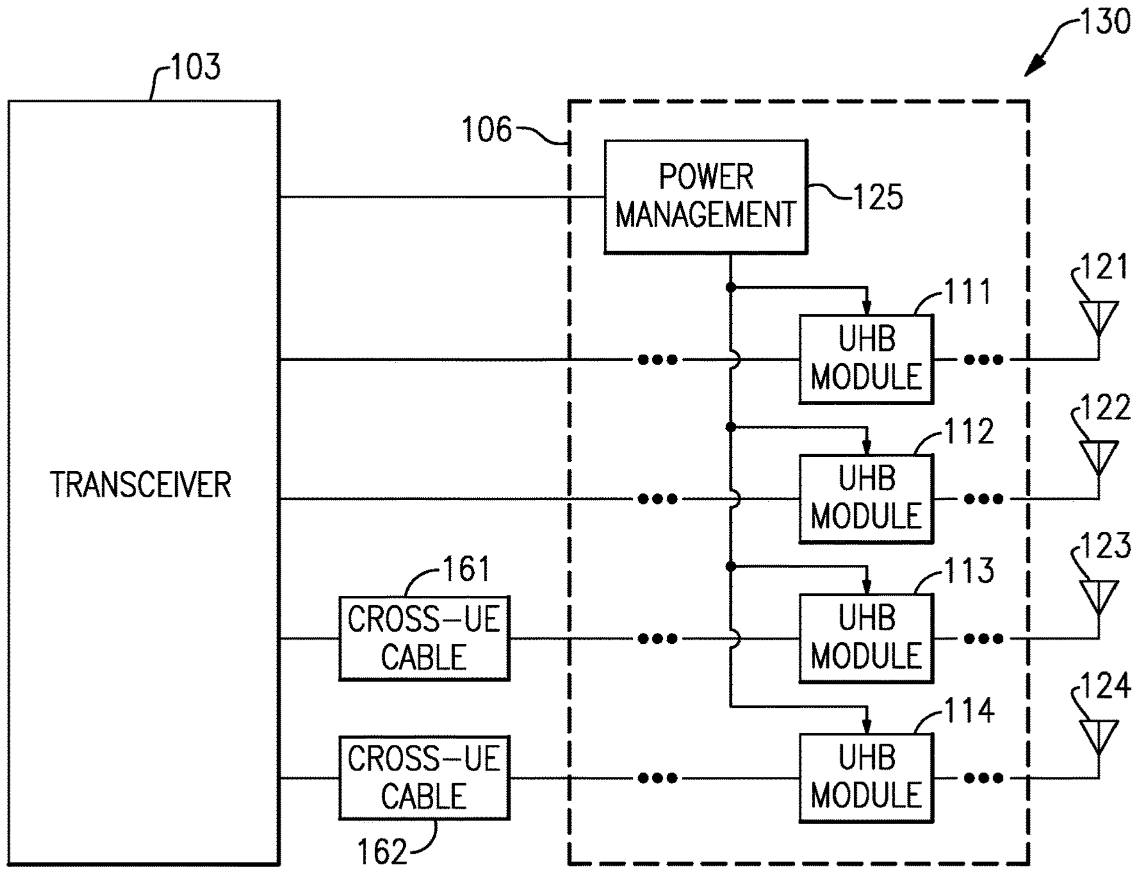
FIG. 4B is a schematic diagram of an exemplary RF system.

FIG. 4B is a schematic diagram of a RF system 130. The RF system 130 includes a transceiver 103, a front-end system 106, a first primary antenna 121, a second primary antenna 122, a first diversity antenna 123, a second diversity antenna 124, a first cross-UE cable 161, and a second cross-UE cable 162. As shown in FIG. 4B, the front-end system 106 includes a first UHB module 111, a second UHB module 112, a third UHB module 113, a fourth UHB module 114, and a power management circuit 125. The front-end system 106 further includes a first primary antenna terminal for coupling to the first primary antenna 121, a second primary antenna terminal for coupling to the second primary antenna 122, a first diversity antenna terminal for coupling to the first diversity antenna 123, and a second diversity antenna terminal for coupling to the second diversity antenna 124.

As shown in FIG. 4B, the first UHB module 111 and the second UHB module 112 communicate using the first primary antenna 121 and the second primary antenna 122, respectively, and are connected to the transceiver 103 without the use of cross-UE cables. Additionally, the third UHB module 113 and the fourth UHB module 114 communicate using the first diversity antenna 123 and the second diversity antenna 124, respectively, and are connected to the transceiver 103 using the first cross-UE cable 161 and the second cross-UE cable 162, respectively.

To reduce the statistical correlation between received signals, the primary antennas 121-122 and the diversity antennas 123-124 can be separated by a relatively large physical distance in the RF system 130. For example, the diversity antennas 123-124 can be positioned near the top of the device and the primary antennas 121-122 can be positioned near the bottom of the device, or vice-versa. Additionally, the transceiver 103 can be positioned near the primary antennas 121-122 and primary modules to enhance performance of primary communications.

Accordingly, in certain implementations, the UHB modules 113-114 and diversity antennas 123-124 can be located at relatively far physical distance from the transceiver 103 and connected to the transceiver 103 via cross-UE cables 161-162, respectively.

In the illustrated example, the front-end system 106 further includes a shared power management circuit 125 used to provide a supply voltage, such as a power amplifier supply voltage, to the UHB modules 111-114.

Providing power to the UHB modules 111-114 using the shared power management circuit 125 can provide a number of advantages, including, for example, high integration, reduced component count, and/or lower cost.

In certain implementations, the shared power management circuit 125 operates using average power tracking (APT), in which the voltage level of the supply voltage provided by the shared power management circuit 125 is substantially fixed over a given communication time slot. In certain implementations, the supply voltage has a relatively high voltage, and thus operates with a corresponding low current. Thus, although the UHB modules 111-114 can be distributed across the device over relatively wide distances and connected using resistive cables and/or conductors, power or I<2>*R losses can be relatively small.

Accordingly, the shared power management circuit 125 can provide high integration with relatively low power loss.

Figure 4C:
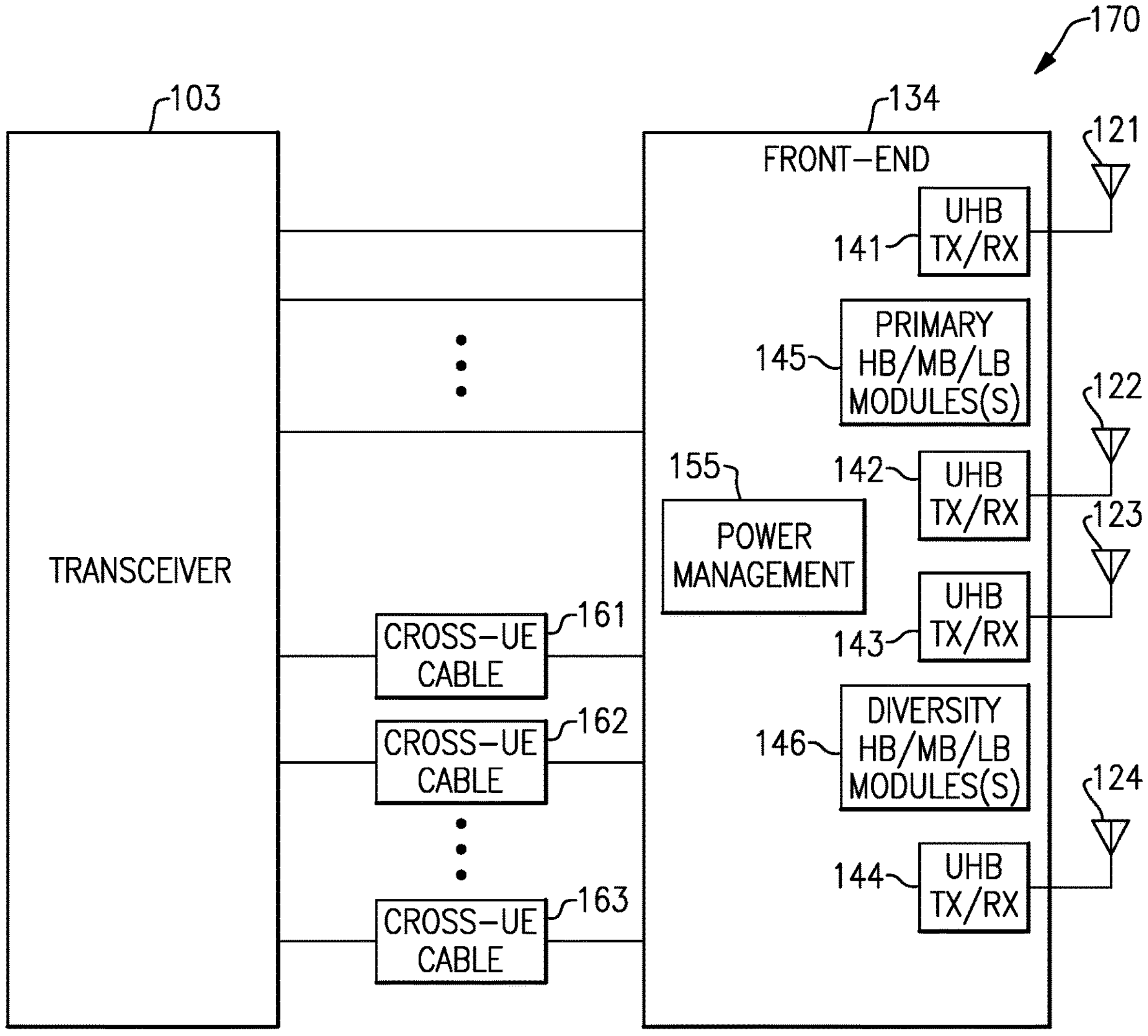
FIG. 4C is a schematic diagram of an exemplary RF system.

FIG. 4C is a schematic diagram of a RF system 170 according to another example. The RF system 170 includes a transceiver 103, a front-end system 134, a first primary antenna 121, a second primary antenna 122, a first diversity antenna 123, a second diversity antenna 124, a first cross-UE cable 161, a second cross-UE cable 162, and a third cross-UE cable 163.

The illustrated RF system 170 is used to transmit and receive signals of a wide variety of frequency bands, including LB, MB, HB, and UHB cellular signals. For example, the RF system 170 can process one or more LB signals having a frequency content of 1 GHz or less, one or more MB signals having a frequency content between 1 GHz and 2.3 GHz, one or more HB signals having a frequency content between 2.3 GHz and 3 GHZ, and one or more UHB signals have a frequency content between 3 GHz and 8 GHz. Examples of LB frequencies include, but are not limited to Band 8, Band 20, and Band 26. Examples of MB frequencies include, but are not limited to, Band 1, Band 3, Band 4, and Band 66. Examples of HB frequencies include, but are not limited to, Band 7, Band 38, and Band 41. Examples of UHB frequencies include, but are not limited to, Band 42, Band 43, and Band 48.

The illustrated front-end system 134 includes one or more primary modules 145 used for transmitting and receive HB, MB, and/or LB signals via the primary antennas 121-122.

Although illustrated as a single block, the primary modules 145 can include multiple modules collectively used to transmit and receive HB, MB, and/or LB signals via the first primary antenna 121 and the second primary antenna 122. Additionally, in certain implementations, the first primary antenna 121 and the second primary antenna 122 can be used for communicating over certain frequency ranges. For instance, in one example, the second primary antenna 122 supports LB communications but the first primary antenna 121 does not support LB communications.

With continuing reference to FIG. 4C, the front-end system 134 further includes one or more diversity modules 146 used for receiving HB, MB, and/or LB diversity signals via the diversity antennas 123-124. In certain implementations, the diversity modules 146 operate to receive but not transmit diversity signals. In other implementations, the diversity modules 146 also can be used for transmitting HB, MB, and/or LB signals.

In the illustrated example, the front-end system 134 further includes a first UHB transmit and receive (TX/RX) module 141 electrically coupled to the first primary antenna 121, a second UHB transmit and receive module 142 electrically coupled to the second primary antenna 122, a third UHB transmit and receive module 143 electrically coupled to the first diversity antenna 123, and a fourth UHB transmit and receive module 144 electrically coupled to the second diversity antenna 124. The front-end system 134 further includes a first primary antenna terminal for coupling to the first primary antenna 121, a second primary antenna terminal for coupling to the second primary antenna 122, a first diversity antenna terminal for coupling to the first diversity antenna 123, and a second diversity antenna terminal for coupling to the second diversity antenna 124.

In the illustrated example, the UHB transmit and receive modules 141-144 support transmit and receive of one or more UHB frequency bands, including, but not limited to, Band 42, Band 43, and/or Band 48.

Accordingly, the UHB transmit and receive modules 141-144 can be used to support 4×4 RX MIMO for UHB, 4×4 TX MIMO for UHB, and/or carrier aggregation using one or more UHB frequency carriers. Carrier aggregation using UHB frequency spectrum can include not only carrier aggregation using two or more UHB frequency carriers, but also carrier aggregation using one or more UHB frequency carriers and one or more non-HB frequency carriers, such as HB and/or MB frequency carriers.

In certain communications networks, a user demand for high downlink data rates can exceed a demand for high uplink data rates. For instance, UEs of the network, such as smartphones, may desire high speed downloading of multimedia content, but uploading relatively little data to the cloud. This in turn, can lead to the network operating with a relatively low UL to DL time slot ratio and limited opportunities for UL communications.

However, DL data rate of a network can be limited or bottlenecked by an UL data rate. For instance, in certain networks, UL data rate must stay within about 5% of DL data rate to support control, acknowledgement, and other overhead associated with the communication link. Accordingly, higher DL data rates can be achieved by increasing UL data rate.

The front-end system 134 of FIG. 4C includes UHB transmit and receive modules that advantageously support both transmission and reception of UHB signals. Accordingly, broadband UL communications via UHB frequency carriers can be achieved, thereby enhancing UL data rate and providing sufficient UL bandwidth to support overhead associated with very high data rate DL communications.

The illustrated RF system 170 advantageously includes four transmit capable UHB transmit and receive modules 141-144 coupled to the antennas 121-124, respectively. Thus, both transmit and receive are equally available at each of the antennas 121-124 for UHB communications. Thus, antenna swap can be accomplished without a swap switch to redirect a trace or route. For example, antenna selection can be achieved by controlling whether or not each UHB transmit and receive module is transmitting or receiving. Accordingly, the RF system 170 achieves antenna swap functionality for UHB without using any antenna swap switch.

In the illustrated example, a shared or common transceiver 103 is used for both 4G/LTE communications using HB, MB, and LB frequencies, and also for UHB communications supporting sub-6 GHz 5G. Thus, rather than using a separate or dedicated 5G front-end and antenna interface, the shared transceiver 103 is used for both 4G/LTE communications via HB, MB, and LB frequencies and 5G UHB communications.

The illustrated RF system 170 also employs diversity communications to enhance performance. To reduce the correlation between received signals, the primary antennas 121-122 and the diversity antennas 123-124 can be separated by a relatively large physical distance in the RF system 170. For example, the diversity antennas 123-124 can be positioned near the top of the device and the primary antennas 121-122 can be positioned near the bottom of the device or vice-versa. Additionally, the transceiver 103 can be positioned near the primary antennas 121-122 and primary modules to enhance performance of primary communications.

Accordingly, in certain implementations, the UHB transmit and receive modules 143-144, the diversity module(s) 146, and the diversity antennas 123-124 can be located at relatively far physical distance from the transceiver 103 and connected to the transceiver 103 via cross-UE cables 161-163. Additionally, the UHB transmit and receive modules 141-144 can be distributed and/or placed in remote locations around the RF system 170. Although three cross-UE cables are illustrated, more or fewer cross-UE cables can be included as indicated by the ellipsis.

In the illustrated example, the front-end system 134 further includes a power management circuit 155. In certain implementations, the power management circuit 155 is used to provide a supply voltage, such as a power amplifier supply voltage, which is shared by multiple components including the UHB transmit and receive modules 141-144.

Providing power to the UHB transmit and receive modules 141-144 using a shared power management circuit can provide a number of advantages, including, for example, high integration, reduced component count, and/or lower cost.

Figure 5:
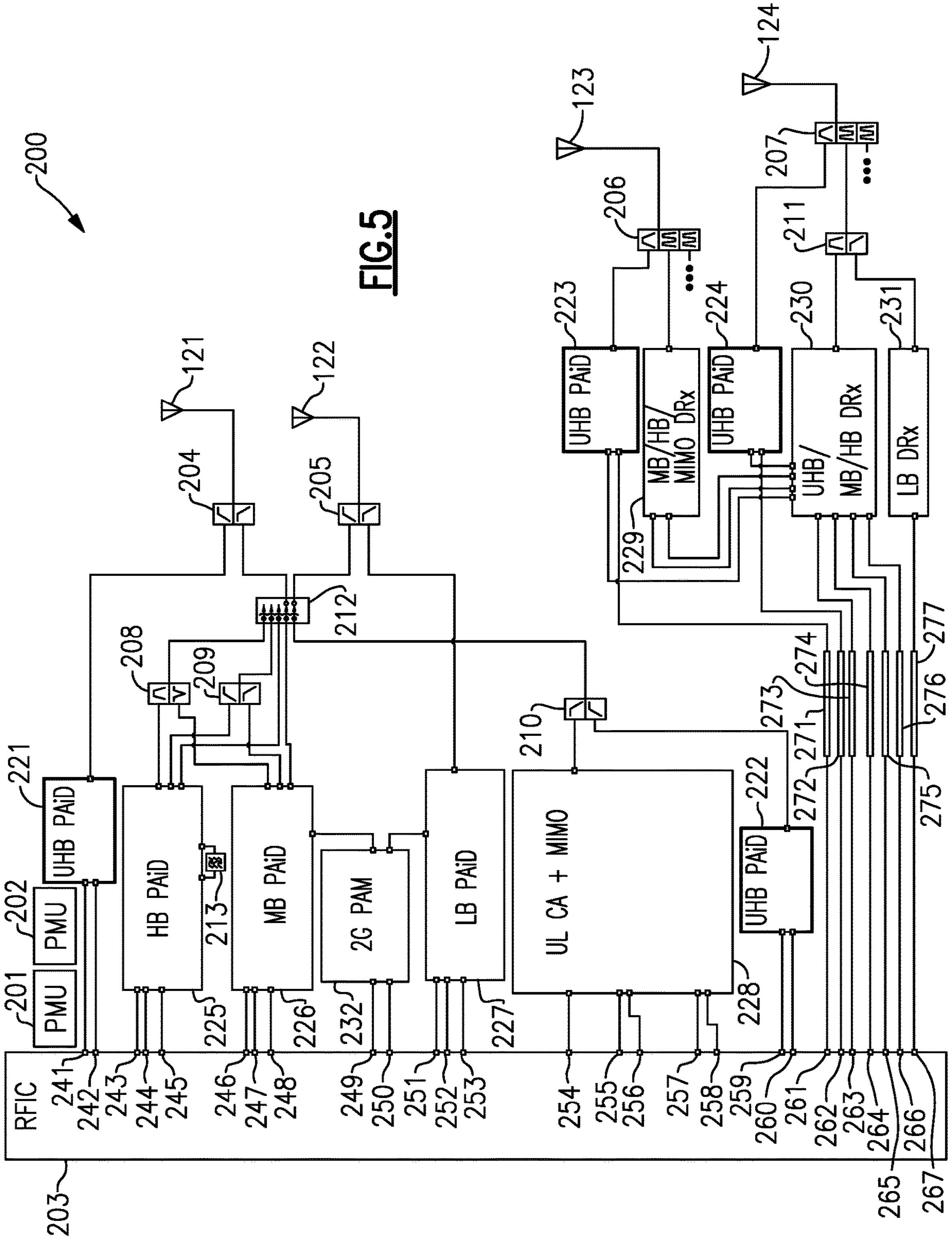
FIG. 5 is a schematic diagram of an exemplary RF system.

FIG. 5 is a schematic diagram of a RF system 200. The RF system 200 includes a first primary antenna 121, a second primary antenna 122, a first diversity antenna 123, a second diversity antenna 124, a first power management unit (PMU) 201, a second PMU 202, a transceiver or RFIC 203, a first primary antenna diplexer 204, a second primary antenna diplexer 205, a first diversity antenna triplexer 206, a second diversity antenna triplexer 207, a first HB/MB diplexer 208, a second HB/MB diplexer 209, a MIMO/UHB diplexer 210, a diversity diplexer 211, a multi-throw switch 212, a HB TDD filter 213, a first UHB power amplifier with integrated duplexer (PAID) module 221, a second UHB PAID module 222, a third UHB PAID module 223, a fourth UHB PAID module 224, a HB PAID module 225, a MB PAID module 226, a LB PAID module 227, an UL CA and MIMO module 228, a MB/HB MIMO diversity receive (DRx) module 229, a UHB/MB/HB DRx module 230, a LB DRx module 231, a 2G power amplifier module (PAM) 232, a first cross-UE cable 271, a second cross-UE cable 272, a third cross-UE cable 273, a fourth cross-UE cable 274, a fifth cross-UE cable 275, a sixth cross-UE cable 276, and a seventh cross-UE cable 277.

The RF system 200 includes a RFFE that provides full sub-6 GHz 5G capability provided by four remote placements of UHB PAID modules 221-224. Although one specific example of a RF system with UHB modules is shown, the teachings herein are applicable to RF electronics implemented in a wide variety of ways. Accordingly, other implementations are possible.

As shown in FIG. 5, the first UHB PAID module 221 is coupled to the first primary antenna 121, and the second UHB PAID module 222 is coupled to the second primary antenna 122. Additionally, the third UHB PAID module 223 is coupled to the first diversity antenna 123, and the fourth UHB PAID module 224 is coupled to the second diversity antenna 124. Accordingly, one UHB PAID module is included for each of the four antennas of this example.

In certain implementations, the UHB PAID modules 221-224 support transmit and receive of one or more UHB frequency bands, including, but not limited to, Band 42, Band 43, and/or Band 48.

The RF system 200 of FIG. 5 supports 4×4 RX MIMO for UHB, 4×4 TX MIMO for UHB, and carrier aggregation (CA) with 4G and/or 5G bands.

As will be described below, the first PMU 201 and the second PMU 202 are used to provide power management to certain modules. For clarity of the figures, a connection from each PMU to the modules it powers is omitted from FIG. 5 to avoid obscuring the drawing.

In the illustrated example, the first PMU 201 operates as a shared power management circuit for the first UHB PAID module 221, the second UHB PAID module 222, the third UHB PAID module 223, and the fourth UHB PAID module 224. The first PMU 201 can be used, for example, to control a power supply voltage level of the UHB PAID modules' power amplifiers. Additionally, the first PMU 201 is also shared with the HB PAID module 225, which transmits and receives HB signals on the first primary antenna 121 and the second primary antenna 122, and with the UL CA and MIMO module 228 used for enhancing MIMO order and a maximum number of supported carriers for carrier aggregation. Thus, the first PMU 201 provides a shared power supply voltage to the UHB PAID modules 221-224, the HB PAID module 225, and the UL CA and MIMO module 228, in this example.

By sharing the first PMU 201 in this manner, a common power management scheme, such as fixed supply wide bandwidth average power tracking (APT), can be advantageously used for the modules.

In the illustrated example, the second PMU 202 generates a shared power supply voltage used by the MB PAID 226 and by the LB PAID module 227.

In certain implementations, the diversity modules and diversity antennas can be located at relatively far physical distance from the RFIC 203, and connected to the RFIC 203 via cross-UE cables 271-277. Thus, the UHB PAID modules 221-224 can be placed in remote locations around the UE phone board.

In certain examples herein, a PMU is shared between at least one UHB module and at least one a HB module or a MB module.

The illustrated RF system 200 of FIG. 5 advantageously includes four transmit capable UHB PAID modules 221-224 coupled to four separate antennas 121-124, respectively, and thus both transmit and receive are equally available at each antenna for UHB communications.

Accordingly, antenna swap can be accomplished without a swap switch to redirect a trace or route. For example, antenna selection can be achieved by controlling which UHB power amplifier(s) of the UHB PAID modules 221-224 are enabled. Similarly, with respect to receive, the antenna selection can be made by controlling which UHB low noise amplifier(s) of the UHB PAID modules 221-224 are turned on. Thus, in this example, antenna swap functionality is achieved without using any antenna swap switch.

In certain implementations, the RFIC of FIG. 5 can provide beam steering and/or different data streams through digital baseband control of a relative phase difference between signals provided to the UHB PAID modules 221-224.

In the illustrated example, the first primary antenna diplexer 204 operates to diplex between UHB frequencies and MB/HB frequencies. Additionally, the second primary antenna diplexer 205 operates to diplex between MB/HB/UHB frequencies and LB frequencies. Furthermore, the first diversity antenna triplexer 206 operates to triplex between UHB frequencies, MB/HB frequencies, and 2 GHz/5 GHz Wi-Fi frequencies. Additionally, the second diversity antenna triplexer 207 operates to triplex between UHB frequencies, LB/HB/MB frequencies, and 2 GHz/5 GHz Wi-Fi frequencies. For clarity of the figures, Wi-Fi modules connected to the first diversity antenna triplexer 206 and to the second diversity antenna triplexer 207 are not illustrated.

With continuing reference to FIG. 5, the first HB/MB diplexer 208 operates to diplex between a first group of HB frequencies (for example, Band 30 and/or Band 40) and MB frequencies. Additionally, the second HB/MB diplexer 209 operates to diplex between a second group of HB frequencies (for example, Band 7 and/or Band 41) and MB frequencies. Furthermore, the MIMO/UHB diplexer 210 operates to diplex between MB/HB frequencies and UHB frequencies. Additionally, the diversity diplexer 211 operates to diplex between MB/HB frequencies and LB frequencies.

In the illustrated example, the RFIC 203 includes a first RX UHB terminal 241, a first TX UHB terminal 242, a first RX HB terminal 243, a second RX HB terminal 244, a TX HB terminal 245, a first RX MB terminal 246, a second RX MB terminal 247, a first TX MB terminal 248, a 2G TX MB terminal 249, a 2G RX MB terminal 250, a first RX LB terminal 251, a second RX LB terminal 252, a TX LB terminal 253, a second TX MB terminal 254, a third RX MB terminal 255, a fourth RX MB terminal 256, a third RX HB terminal 257, a fourth RX HB terminal 258, a second RX UHB terminal 259, a second TX UHB terminal 260, a third TX UHB terminal 261, a fourth TX UHB terminal 262, a first shared RX UHB/HB terminal 263, a second shared RX UHB/HB terminal 264, a first shared RX MB/HB terminal 265, a second shared RX MB/HB terminal 266, and a LB RX terminal 267. As shown in FIG. 5, certain terminals are shared across multiple bands to share resources and/or reduce signal routes (for instance, to use fewer cross-UE cables).

Although one example of a RF system 200 is shown in FIG. 5, the teachings herein are applicable to RF systems implemented in a wide variety of ways.

Figure 6:
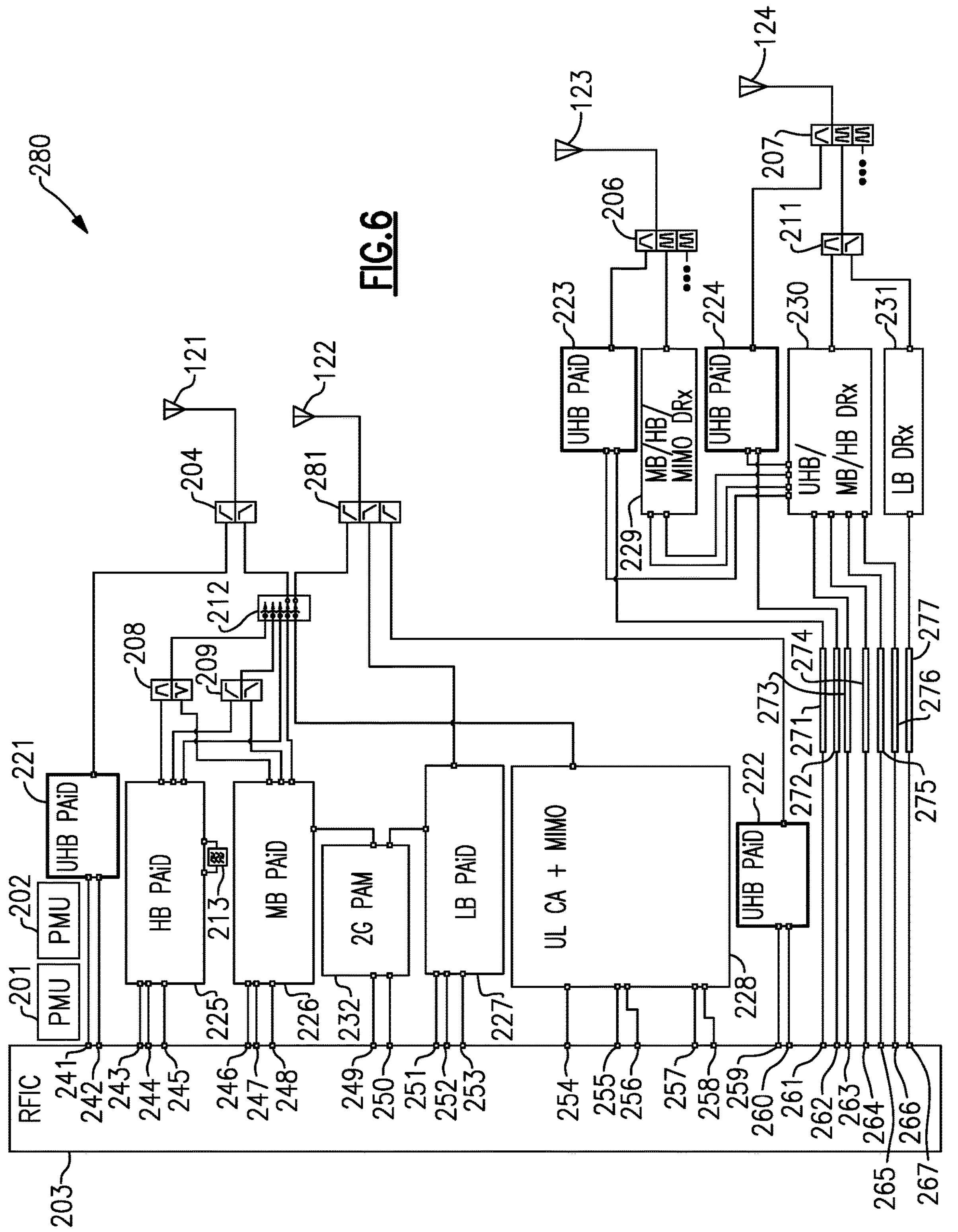
FIG. 6 is a schematic diagram of an exemplary RF system.

FIG. 6 is a schematic diagram of a RF system 280 according to another example. The RF system 280 includes a first primary antenna 121, a second primary antenna 122, a first diversity antenna 123, a second diversity antenna 124, a first PMU 201, a second PMU 202, a RFIC 203, a primary antenna diplexer 204, a primary antenna triplexer 281, a first diversity antenna triplexer 206, a second diversity antenna triplexer 207, a first HB/MB diplexer 208, a second HB/MB diplexer 209, a diversity diplexer 211, a multi-throw switch 212, a HB TDD filter 213, a first UHB PAID module 221, a second UHB PAID module 222, a third UHB PAID module 223, a fourth UHB PAID module 224, a HB PAID module 225, a MB PAID module 226, a LB PAID module 227, an UL CA and MIMO module 228, a MB/HB MIMO DRx module 229, a UHB/MB/HB DRx module 230, a LB DRx module 231, a 2G PAM 232, and first to seventh cross-UE cables 271-277, respectively.

The RF system 280 of FIG. 6 is similar to the RF system 200 of FIG. 5, except that the RF system 280 of FIG. 6 includes the primary antenna triplexer 281 rather than the second primary antenna diplexer 205, and omits the MIMO/UHB diplexer 210 in favor of connecting the second UHB PAID module 222 to the second primary antenna 122 by way of the primary antenna triplexer 281.

Implementing the RF system 280 in this manner connects the second UHB PAID module 222 to the second primary antenna 122 with lower loss relative to the example of FIG. 5. Thus, the RF system 280 of FIG. 6 has lower insertion loss for certain UHB signal paths, which can enhance the performance of certain CA combinations and/or when operating using UHB MIMO communications.

Figure 7A:
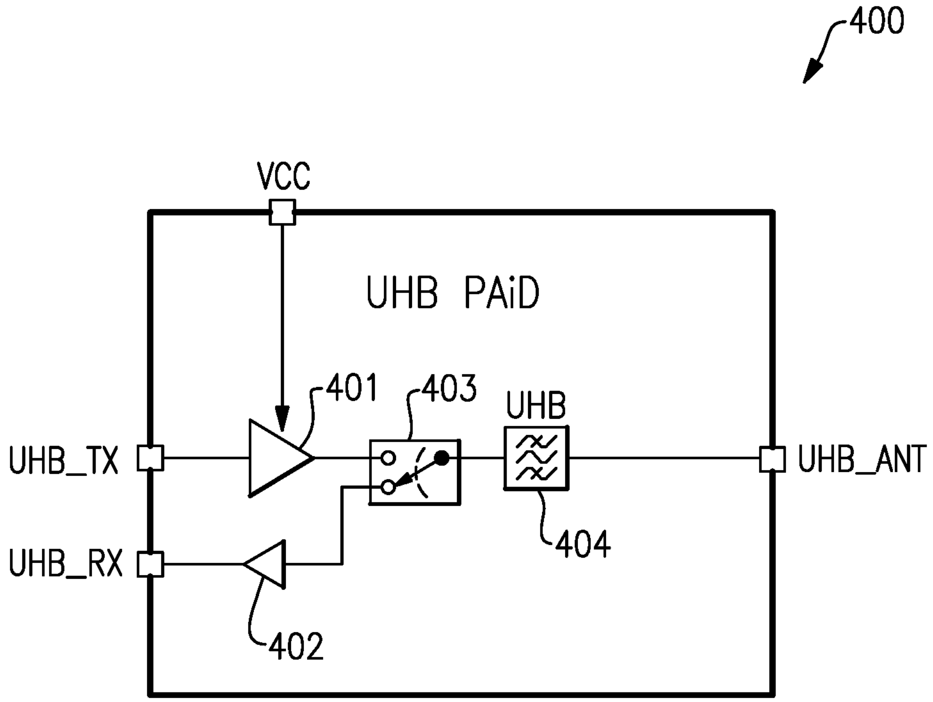
FIG. 7A is a schematic diagram of an exemplary ultrahigh band (UHB) transmit and receive module.

FIG. 7A is a schematic diagram of a UHB transmit and receive module 400 according to one example. The UHB transmit and receive module 400 operates to generate a UHB signal for transmission and to process a UHB signal received from an antenna.

The UHB transmit and receive module 400 illustrates one implementation of a UHB module suitable for incorporation in a RF system, such as any of the RF systems of FIGS. 4A-6. Although the UHB transmit and receive module 400 illustrates one implementation of a UHB module, the teachings herein are applicable to RF electronics including UHB modules implemented in a wide variety of ways. Accordingly, other implementations of UHB modules are possible, such as UHB modules with more or fewer pins, different pins, more or fewer components, and/or a different arrangement of components.

The UHB transmit and receive module 400 includes a power amplifier 401, a low noise amplifier 402, a transmit/receive switch 403, and a UHB filter 404, which is used to pass one or more UHB bands, for instance, Band 42, Band 43, and/or Band 48. The UHB transmit and receive module 400 further includes a variety of pins, including a UHB_TX pin for receiving a UHB transmit signal for transmission, a UHB_RX pin for outputting a UHB receive signal, a UHB_ANT pin for connecting to an antenna, and a VCC pin for receiving a supply voltage for powering at least the power amplifier 401. In certain implementations, the VCC pin receives a shared supply voltage from a power management circuit (for example, a PMU) shared by multiple modules.

The illustrated UHB transmit and receive module 400 provides both transmit and receive functionality for UHB signals. Thus, when four instantiations of the UHB transmit and receive module 400 are coupled directly or indirectly to four antennas, both 4×4 RX MIMO for UHB and 4×4 TX MIMO for UHB can be achieved. Additionally, the UHB transmit and receive modules can be used to support carrier aggregation for UL and/or DL using one or more UHB carrier frequencies.

Figure 7B:
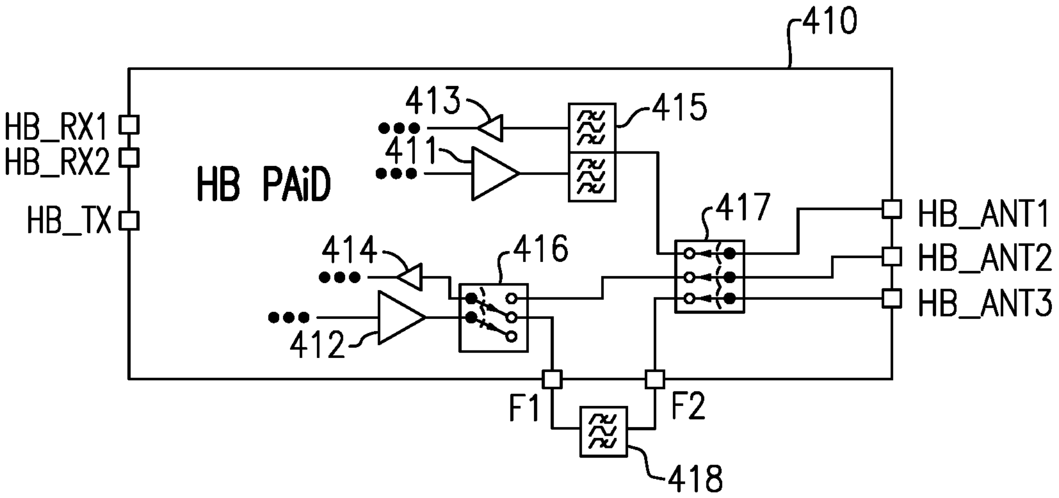
FIG. 7B is a schematic diagram of an exemplary high band (HB) transmit and receive module.

FIG. 7B is a schematic diagram of a HB transmit and receive module 410 according to one example.

The RF systems disclosed herein can include one or more implementations of the HB transmit and receive module 410. Although the HB transmit and receive module 410 illustrates one implementation of a HB module, the teachings herein are applicable to RF electronics including HB modules implemented in a wide variety of ways as well as to RF electronics implemented without HB modules.

The HB transmit and receive module 410 includes a first power amplifier 411 for FDD communications, a second power amplifier 412 for TDD communications, a first low noise amplifier 413 for FDD communications, a second low noise amplifier 414 for TDD communications, a FDD duplexer 415, a transmit/receive switch 416, and a multi-throw switch 417. An external TDD filter 418 is also included in this example. In another example, the TDD filter 418 is included within the module 410.

The HB transmit and receive module 410 further includes a variety of pins, including a HB_TX pin for receiving a HB transmit signal for transmission, a HB_RX1 pin for outputting a first HB receive signal, a HB_RX2 pin for outputting a second HB receive signal, a F1 pin for connecting to one terminal of the external TDD filter 418, and a F2 pin for connecting to another terminal of the external TDD filter 418. The module 410 further includes a HB_ANT1 pin, a HB_ANT2 pin, and a HB_ANT3 pin for connecting to one or more antennas.

Figure 7C:
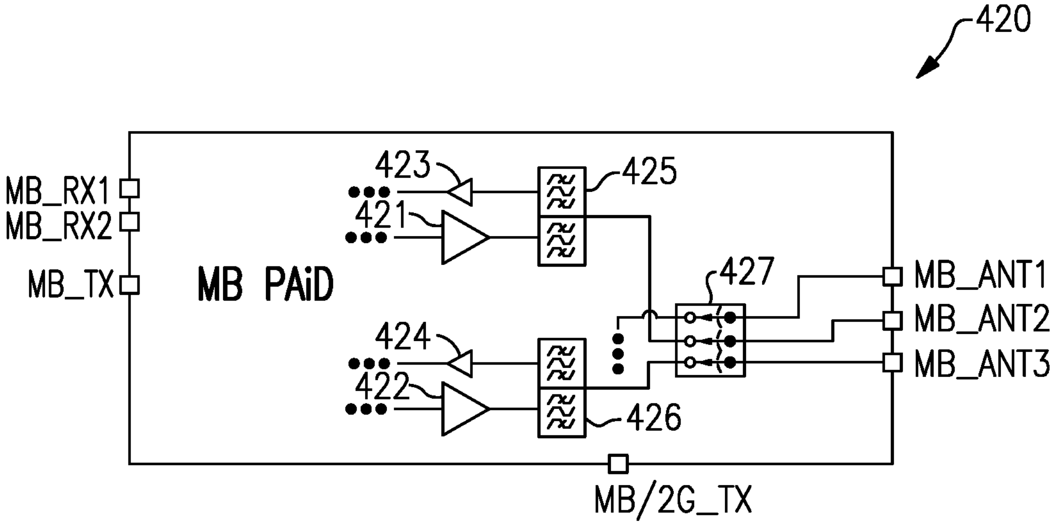
FIG. 7C is a schematic diagram of an exemplary mid band (MB) transmit and receive module.

FIG. 7C is a schematic diagram of a MB transmit and receive module 420 according to one example.

The RF systems disclosed herein can include one or more implementations of the MB transmit and receive module 420. Although the MB transmit and receive module 420 illustrates one implementation of a MB module, the teachings herein are applicable to RF electronics including MB modules implemented in a wide variety of ways as well as to RF electronics implemented without MB modules.

The MB transmit and receive module 420 includes a first power amplifier 421, a second power amplifier 422, a first low noise amplifier 423, a second low noise amplifier 424, a first duplexer 425, a second duplexer 426, and a multi-throw switch 427. In certain implementations, the first duplexer 425 and the second duplexer 426 provide duplexing to different MB frequency bands. In one example, the first duplexer 425 is operable to duplex Band 3, while the second duplexer 426 is operable to duplex at least one of (or both of) Band 1 and Band 66.

The MB transmit and receive module 420 further includes a variety of pins, including a MB_TX pin for receiving a MB transmit signal for transmission, a MB_RX1 pin for outputting a first MB receive signal, a MB_RX2 pin for outputting a second MB receive signal, and a MB/2G_TX pin for receiving a 2G transmit signal for transmission. The module 420 further includes a MB_ANT1 pin, a MB_ANT2 pin, and a MB_ANT3 pin for connecting to one or more antennas.

Figure 7D:
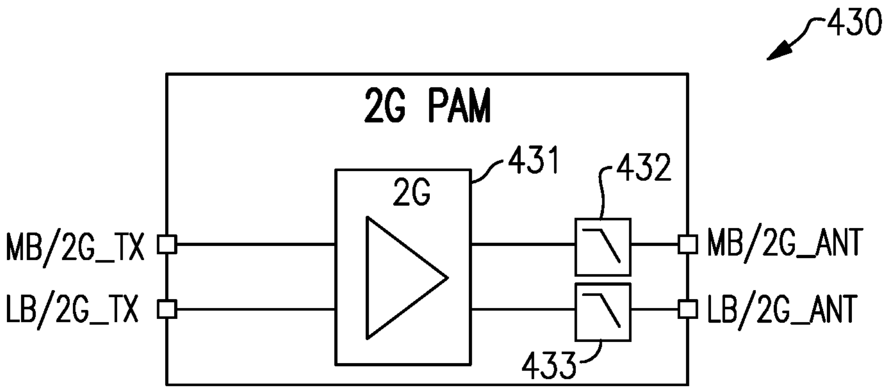
FIG. 7D is a schematic diagram of an exemplary 2G power amplifier module (2G PAM).

FIG. 7D is a schematic diagram of a 2G power amplifier module (PAM) 430 according to one example.

The RF systems disclosed herein can include one or more instantiations of the 2G PAM 430. Although the 2G PAM 430 illustrates one implementation of a 2G module, the teachings herein are applicable to RF electronics including 2G modules implemented in a wide variety of ways as well as to RF electronics implemented without 2G modules.

The 2G PAM 430 includes power amplifier circuitry 431, a MB 2G filter 432, and a LB 2G filter 433. The 2G PAM 430 further includes a variety of pins, including a MB/2G_TX pin for receiving a 2G MB transmit signal for transmission and a LB/2G_TX pin for receiving a 2G LB transmit signal for transmission. The module 430 further includes a MB/2G_ANT pin and a LB/2G_ANT pin for connecting to one or more antennas.

Figure 7E:
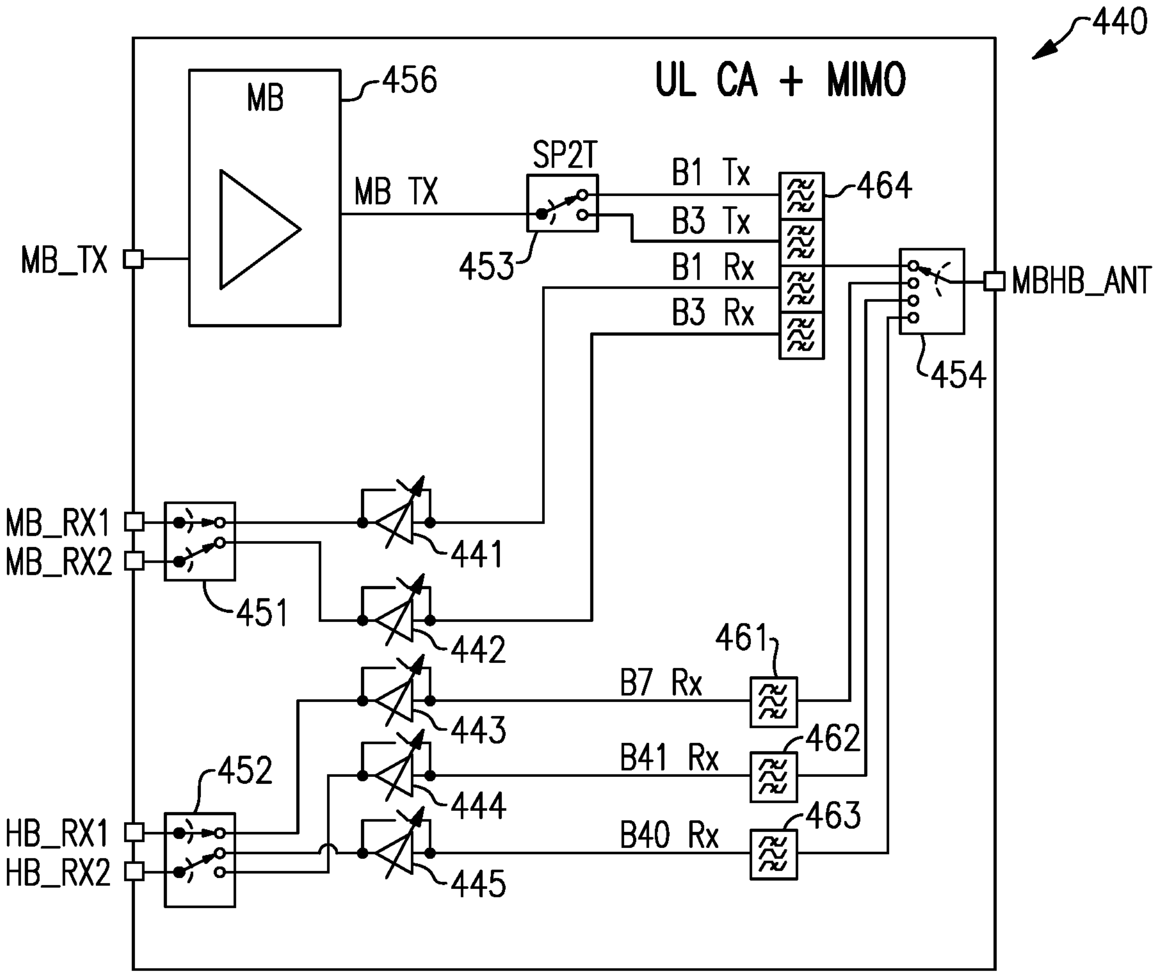
FIG. 7E is a schematic diagram of an uplink carrier aggregation and MIMO module.

FIG. 7E is a schematic diagram of an uplink carrier aggregation and MIMO (UL CA+MIMO) module 440 according to one embodiment.

The RF systems disclosed herein can include one or more instantiations of the UL CA+MIMO module 440. Although the UL CA+MIMO module 440 illustrates one implementation of a CA/MIMO module, the teachings herein are applicable to RF electronics including CA/MIMO modules implemented in a wide variety of ways as well as to RF electronics implemented without CA/MIMO modules.

The UL CA+MIMO module 440 includes MB power amplifier circuitry 456, a MB transmit selection switch 453, a MB quadplexer 464, a multi-throw switch 454, a first HB receive filter 461, a second HB receive filter 462, a third HB receive filter 463, a MB receive selection switch 451, a HB receive selection switch 452, a first HB low noise amplifier 441 (with bypass and gain control functionality, in this embodiment), a second HB low noise amplifier 442, a third HB low noise amplifier 443, a fourth HB low noise amplifier 444, and a fifth HB low noise amplifier 445. The UL CA+MIMO module 440 is annotated to show example frequency bands for operation, including Band 1 and Band 3 for MB and Band 7, Band 40, and Band 41 for HB. However, the UL CA+MIMO module 440 can be implemented to operate with other MB frequency bands and/or HB frequency bands.

The UL CA+MIMO module 440 further includes a variety of pins, including a MB_TX pin for receiving a MB transmit signal for transmission, a MB_RX1 pin for outputting a first MB receive signal, a MB_RX2 pin for outputting a second MB receive signal, a HB_RX1 pin for outputting a first HB receive signal, a HB_RX2 pin for outputting a second HB receive signal, and a MBHB_ANT pin for connecting to an antenna.

Figure 8A:
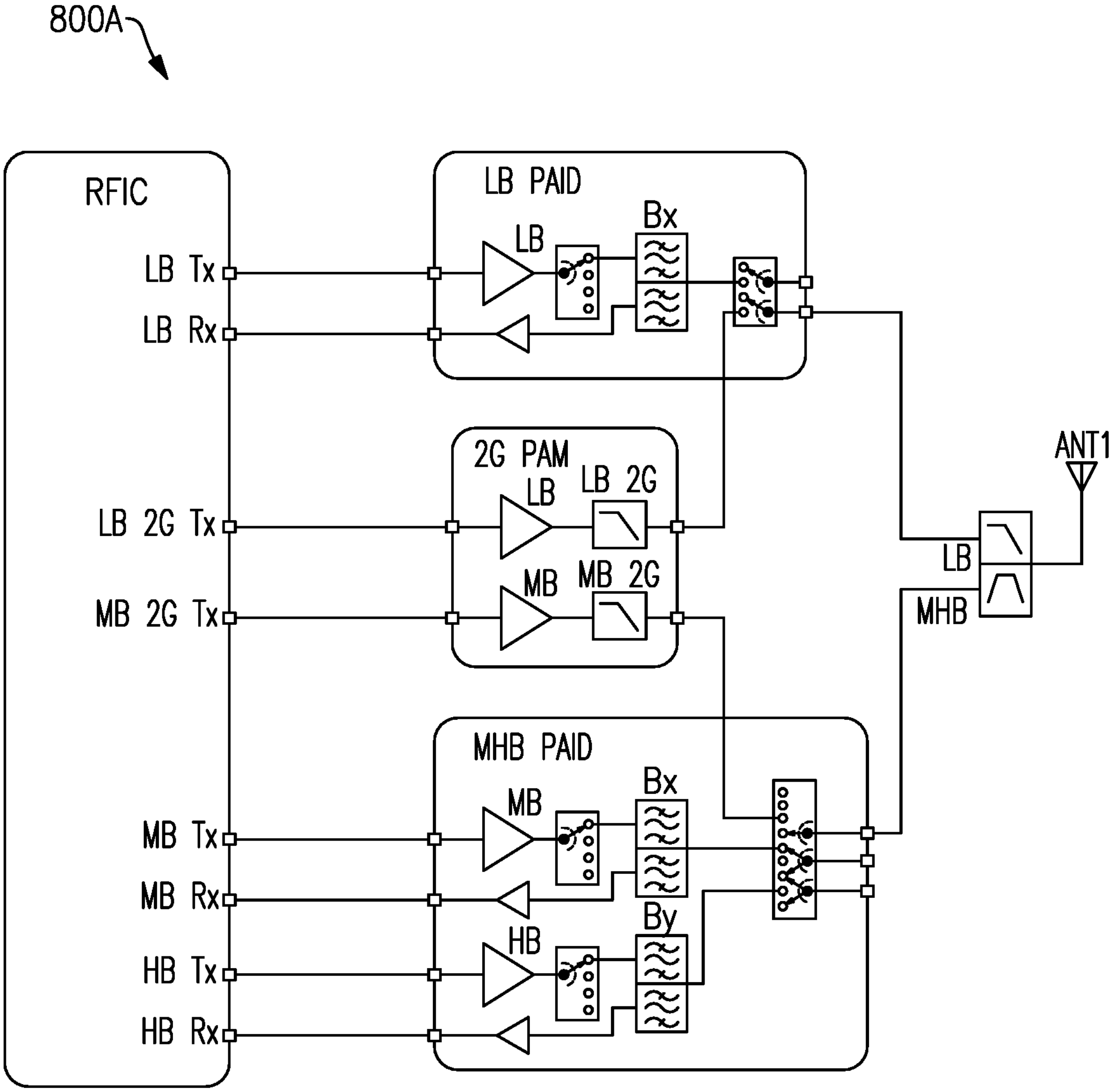
FIG. 8A is a schematic diagram of a conventional ramping technology having a 2G PAM in which linear power ramping is performed from the RFIC and the power amplifier has a linear gain (linear 2G).

FIG. 8A shows a schematic diagram of a conventional ramping technology having a 2G PAM. Power ramping is performed linearly from the RFIC. Each of the LB power amplifier and the MB power amplifier can have a linear gain. For example, the transmit signals LB 2G Tx and MB 2G Tx can be ramped directly by the RFIC. The ramping technology is referred to as linear 2G.

Figure 8B:
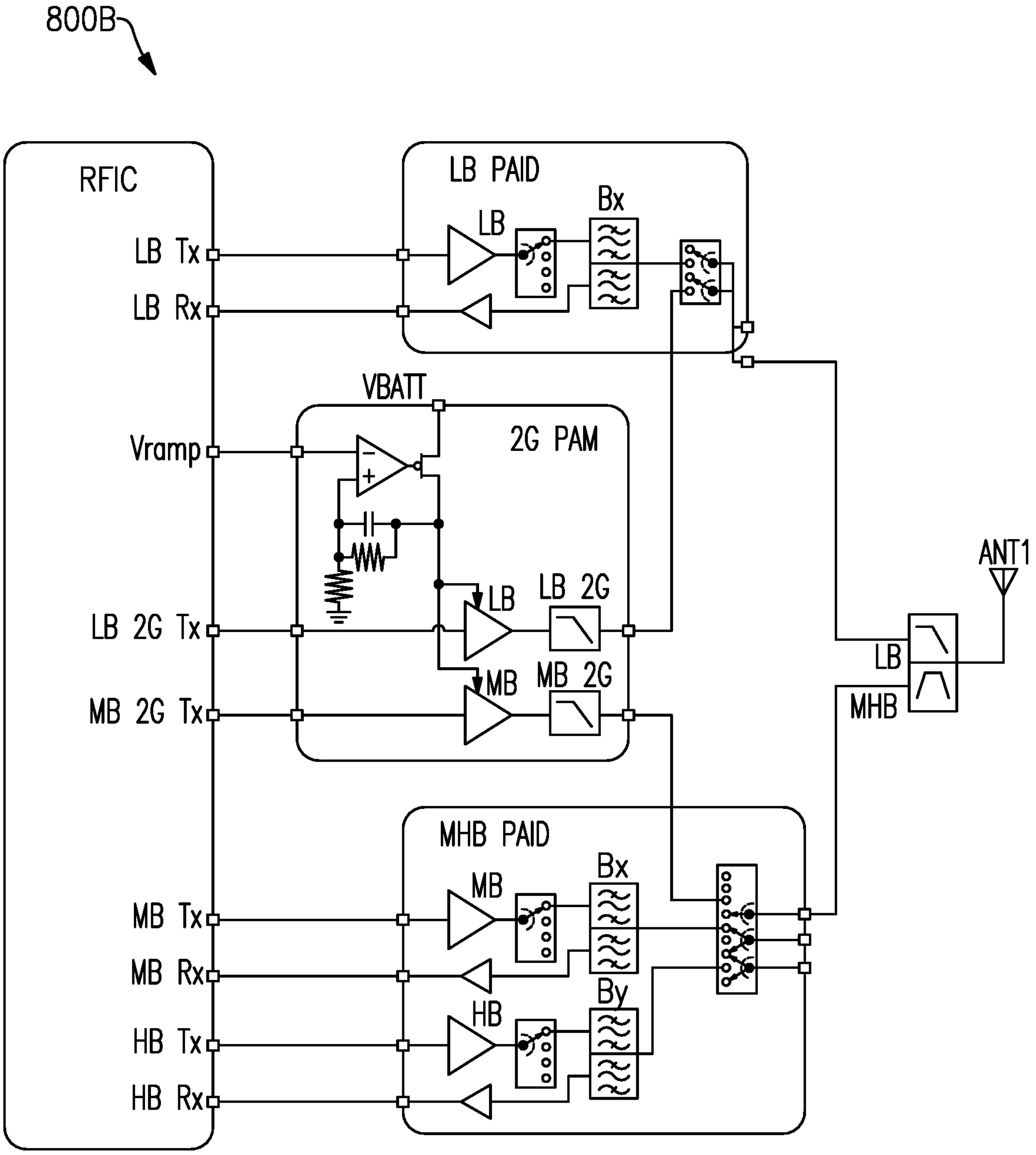
FIG. 8B is a schematic diagram of a conventional ramping technology having a 2G PAM in which power ramping is performed from VCC variation and the power amplifier has a variable gain being a function of VCC (collector voltage amplitude controller 2G, COVAC 2G).

FIG. 8B shows a schematic diagram of a conventional ramping technology having a 2G PAM. Power ramping is performed according to a VCC variation. The LB and MB power amplifiers each have a variable gain being a function of VCC, which is corresponds to the Vramp signal output by the RFIC. The ramping technology is referred to as collector voltage amplitude controlled 2G (COVAC 2G).

Figure 8C:
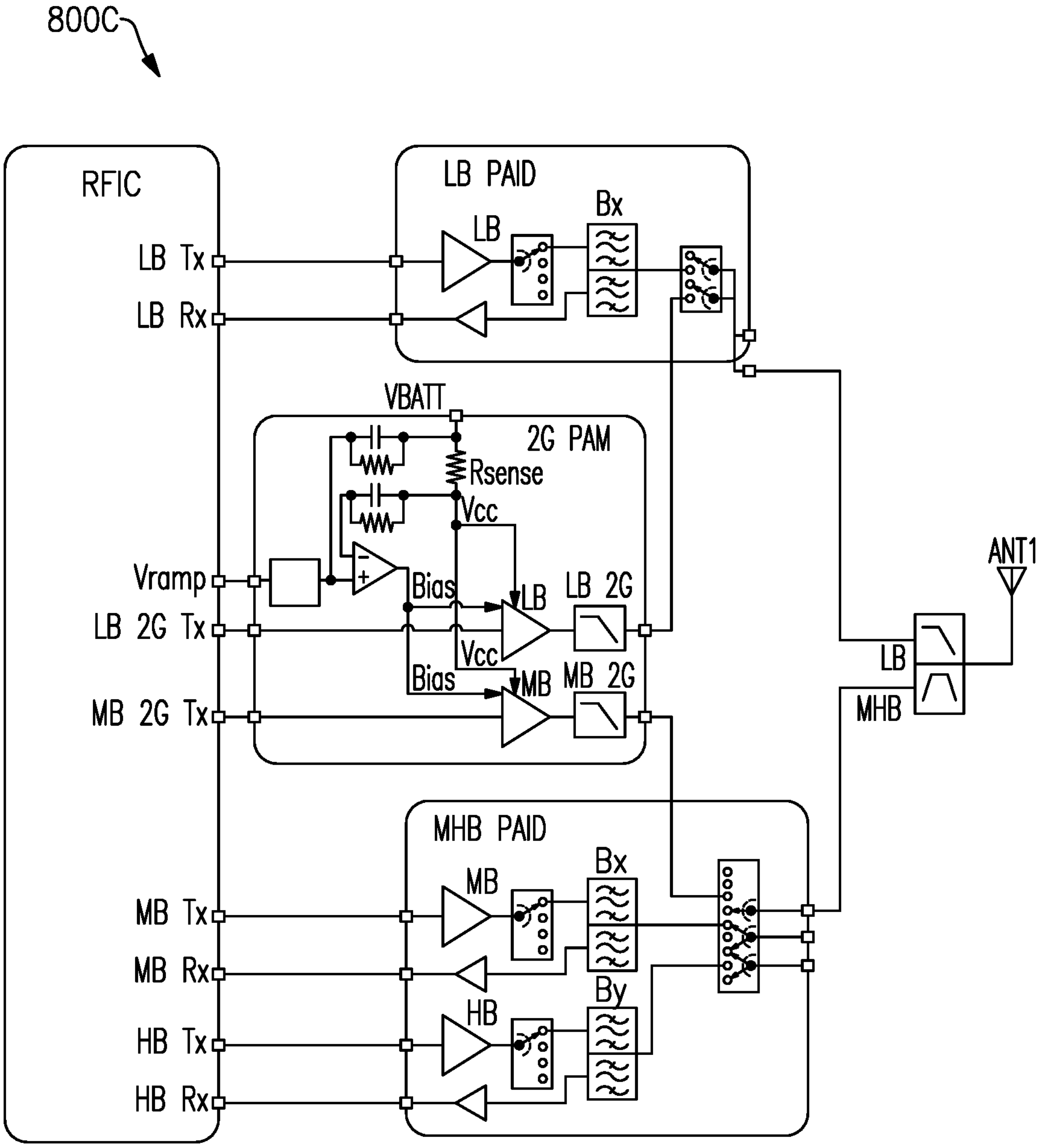
FIG. 8C is a schematic diagram of a conventional ramping technology having a 2G PAM in which power ramping is performed from Vbias variation, the power amplifier has a variable gain being a function of Vbias, and a finger-based integrated power amplifier control (iPAC) avoids series DC losses (iPAC 2G).

FIG. 8C shows a schematic diagram of a conventional ramping technology having a 2G PAM. Power ramping is performed according to a Vbias variation. Each of the LB and MB power amplifiers has a variable gain being a function of Vbias, which is derived from the Vramp signal output by the RCIC. A finger-based integrated power amplifier control (iPAC) avoids series DC losses. The ramping technology is referred to as iPAC 2G.

Figure 9A:
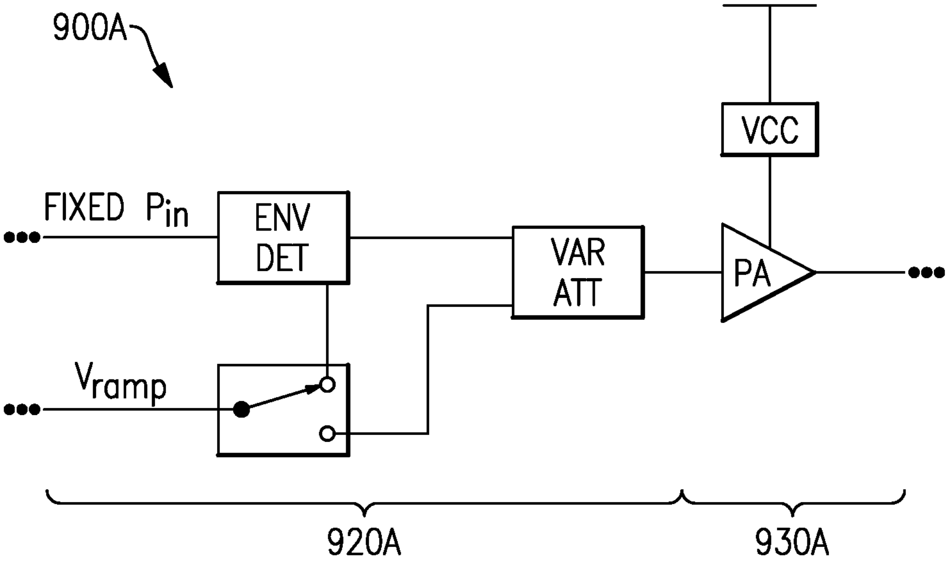
FIG. 9A is a schematic diagram of a consolidated ramping technology in which a fixed linear gain stage power amplifier (PA) may be combined with a variable driver stage.

FIG. 9A shows a schematic diagram of a consolidated ramping technology 900A in which a fixed linear gain stage power amplifier 930A may be combined with a variable driver stage 920A. The purpose of the variable driver stage 920A is to apply a ramp profile according to the provided $V_{ramp}$ signal, and/or supporting a linear 2G ramping by setting the gain stages to a fixed target value appropriate for the maximum power, and to support ramping by both methods within a single design. FIG. 9A indicates the extra variable driver stage 920A where $V_{ramp}$ can be applied directly to vary the attenuation of a variable attenuator. This is proposed to be either with 1) detection of the incoming signal envelope, which is employed to set $V_{ramp}$ and establish the $V_{ramp}$ profile on the drive signal to the linear PA 930A that follows, or 2) flip the input switch such that $V_{ramp}$ can control the variable attenuator directly. In this way, both the linear and $V_{ramp}$ methods can be supported. In addition, the variable attenuator might simply be bypassed using switching to directly amplify with a linear 2G PA 930A following the attenuator. In another embodiment, the switch does not connect Vramp to the envelope detector as shown, but instead, depending on the state of the switch either 1) connects Vramp to the variable attenuator to drive the variable attenuator according to Vramp or 2) connects the envelope detector to the variable attenuator to drive the variable attenuator according to the detected envelope signal.

Figure 9B:
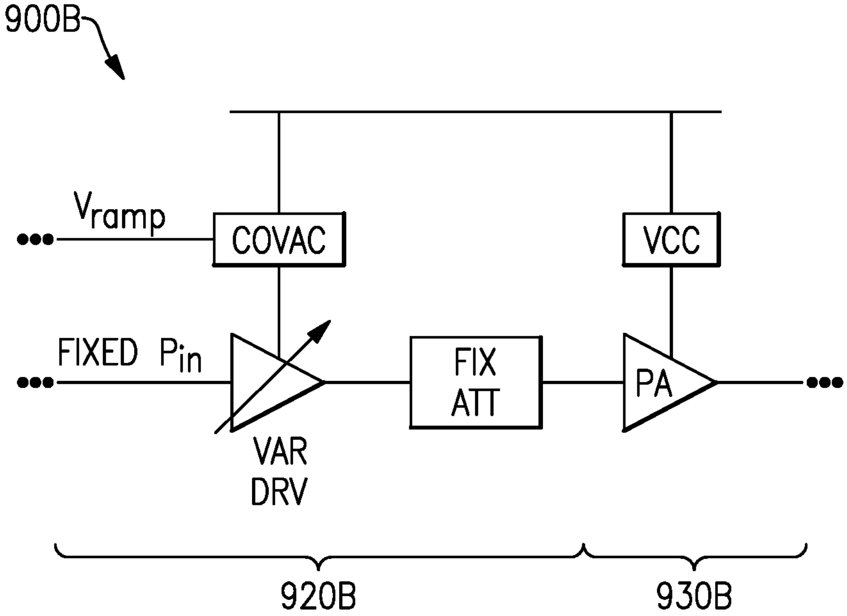
FIG. 9B is a schematic diagram of a consolidated ramping technology in which a COVAC system is combined with a variable driver stage to reconstruct a ramp just on the driver amplifier.

FIG. 9B shows a schematic diagram of a consolidated ramping technology 900B in which a COVAC system is combined with a variable driver stage 920B to reconstruct a ramp just on the driver amplifier. The ramp is established and going into the linear 2G PA. The variable gain driver stage 920B may comprise a fixed attenuator, e.g. depending on the optimization of a gain, a noise and/or an output power capability. The COVAC supply variation is typically quite large and expensive in die area to minimize DC losses and efficiency penalty. At very low power, the implementation can, however, be made extremely small and cost effectively integrated.

Figure 9C:
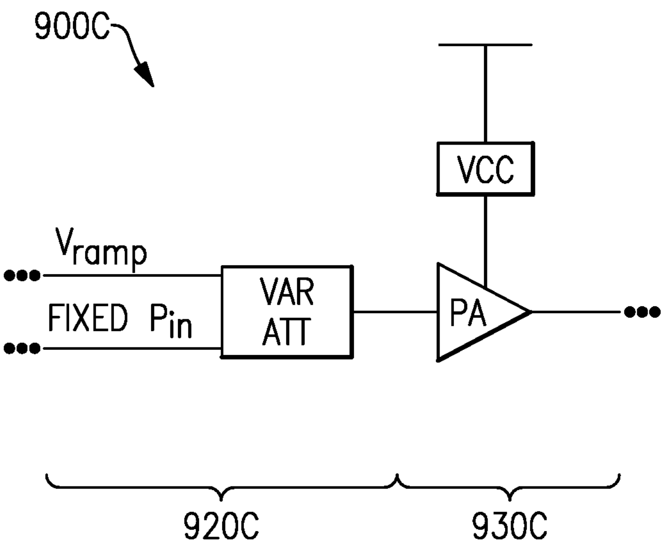
FIG. 9C is a schematic diagram of a consolidated ramping technology employing direct Vramp control of a variable attenuator as in FIG. 9A without an envelope detector.

FIG. 9C is a schematic diagram of a consolidated ramping technology 900C employing direct $V_{ramp}$ control of a variable attenuator as in FIG. 9A without an envelope detector. The variable driver stage 920C does not require an envelope detector and does not require use of the envelope to set $V_{ramp}$. In case of a linear 2G drive signal, the attenuator can be set to a fixed minimum attenuation setting and allow the 2G ramp to propagate through the linear 2G PA.

Figure 9D:
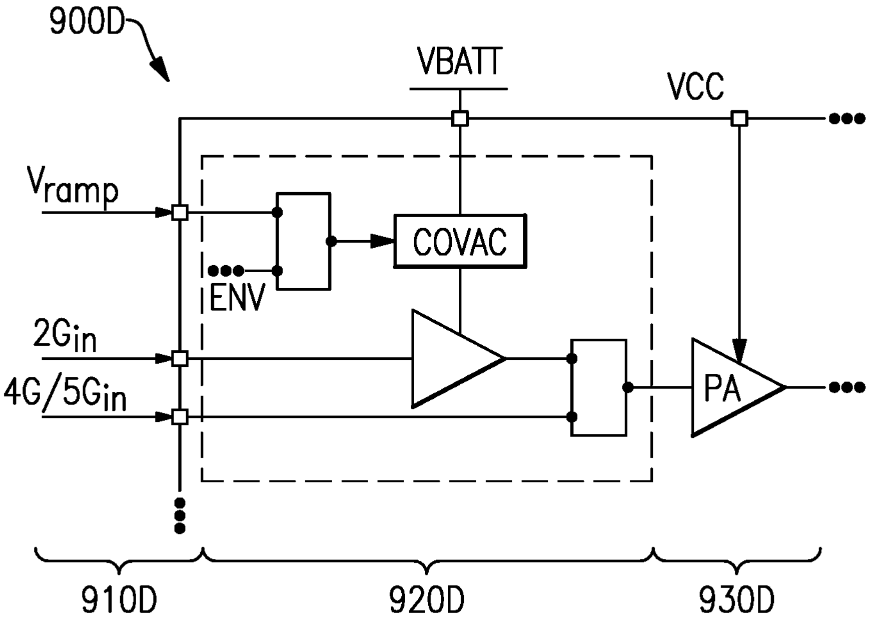
FIG. 9D is a schematic diagram of a consolidated ramping technology enabling re-use of the latest existing power amplifier technology and ramping in 2G.

FIG. 9D is a schematic diagram of a consolidated ramping technology 900D enabling re-use of the latest existing power amplifier technology and ramping in 2G. A COVAC system is combined in a variable driver stage 920D to reconstruct a ramp on a driver amplifier. Envelope tracking may be employed. A switch is added to the variable driver stage 920D at the input of, for instance, an existing (as is) linear 4G/5G PA 930D to support multiple ramping methods within a single design. Bias of the existing 4G/5G PA may need to be adjusted for 2G (8 PSK) linearity margin on an output radio frequency spectrum (ORFS) at +/−400 kHz, etc.

Figure 9E:
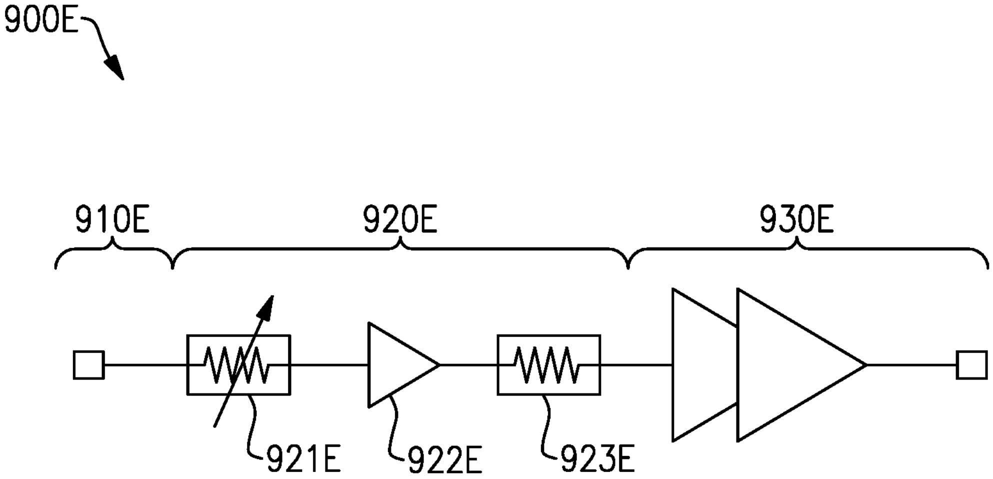
FIG. 9E is a schematic diagram of a consolidated ramping technology enabling re-use of the latest existing power amplifier technology and ramping in 2G.

FIG. 9E is a schematic diagram of a consolidated ramping technology 900E enabling re-use of the latest existing power amplifier technology and ramping in 2G. The ramping technology 900E comprises a variable driver stage 920E coupled between an input pin at 910E and a power amplifier 930E according to the latest existing power amplifier technology. The variable driver stage 920E may comprise a voltage variable attenuator 921E, a driver amplifier 922E, and a pre-PA attenuator 923E. The power amplifier 930E may be coupled between the pre-PA attenuator 923E and an output pin 940E. Table 1 summarizes the gain, cumulative gain, power, noise figure, noise and cumulative noise in dBm for an exemplary ramping technology 900E shown in FIG. 9E and detailed in the subsequent figures. 2G mid-band (MB) path requires more gain than NR (approximately 3 dB) and targets 30 dBm at the antenna. Cumulative noise is less than 71 dBm for MB.

TABLE 1

| | | variable driver stage 920E | | | |
|---|---|---|---|---|---|
| | RFIC 910E | voltage variable attenuator 921E | driver amplifier 922E | pre-PA attenuator 923E | power amplifier 930E |
| gain | | −2.00 | 10.00 | −3.00 | 30.00 |
| cumulative gain | | −2.00 | 8.00 | 5.00 | 35.00 |
| power | −3.00 | −5.00 | 5.00 | 2.00 | 32.00 |
| noise figure | | 2.00 | 3.00 | 3.00 | 5.00 |
| added noise | −117.00 | | −111.00 | | −89.00 |
| cumulative noise | −117.00 | 119.00 | −106.88 | −109.88 | −79.37 |

A 2G mid-band path requires more gain than NR (approximately 3 dB) and targets 30 dBm at the antenna.

Figure 9F:
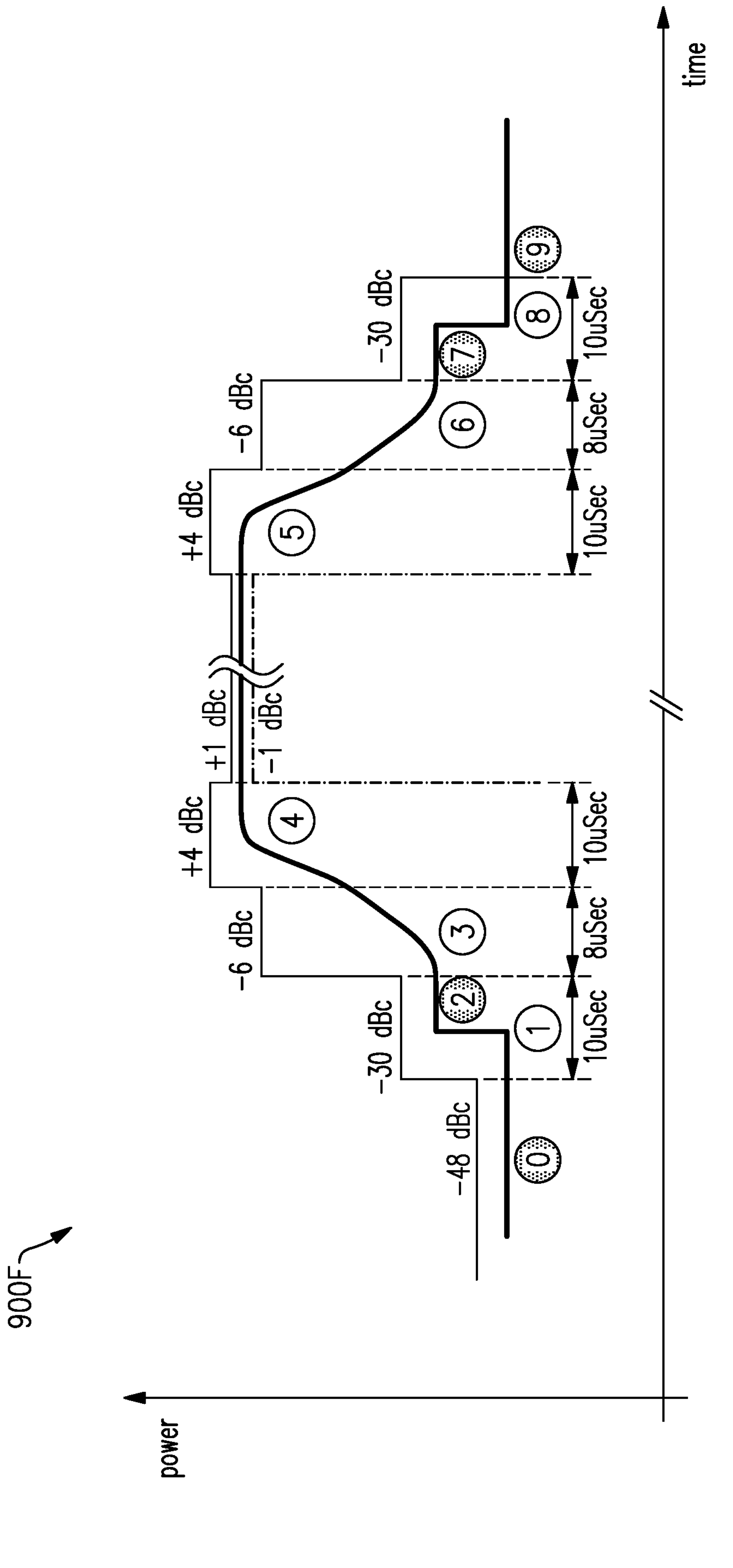
FIG. 9F is a schematic diagram of an exemplary power ramping in time.

FIG. 9F shows a schematic diagram of an exemplary power ramping in time. Ramp down and ramp up may be symmetric.

Figure 10A:
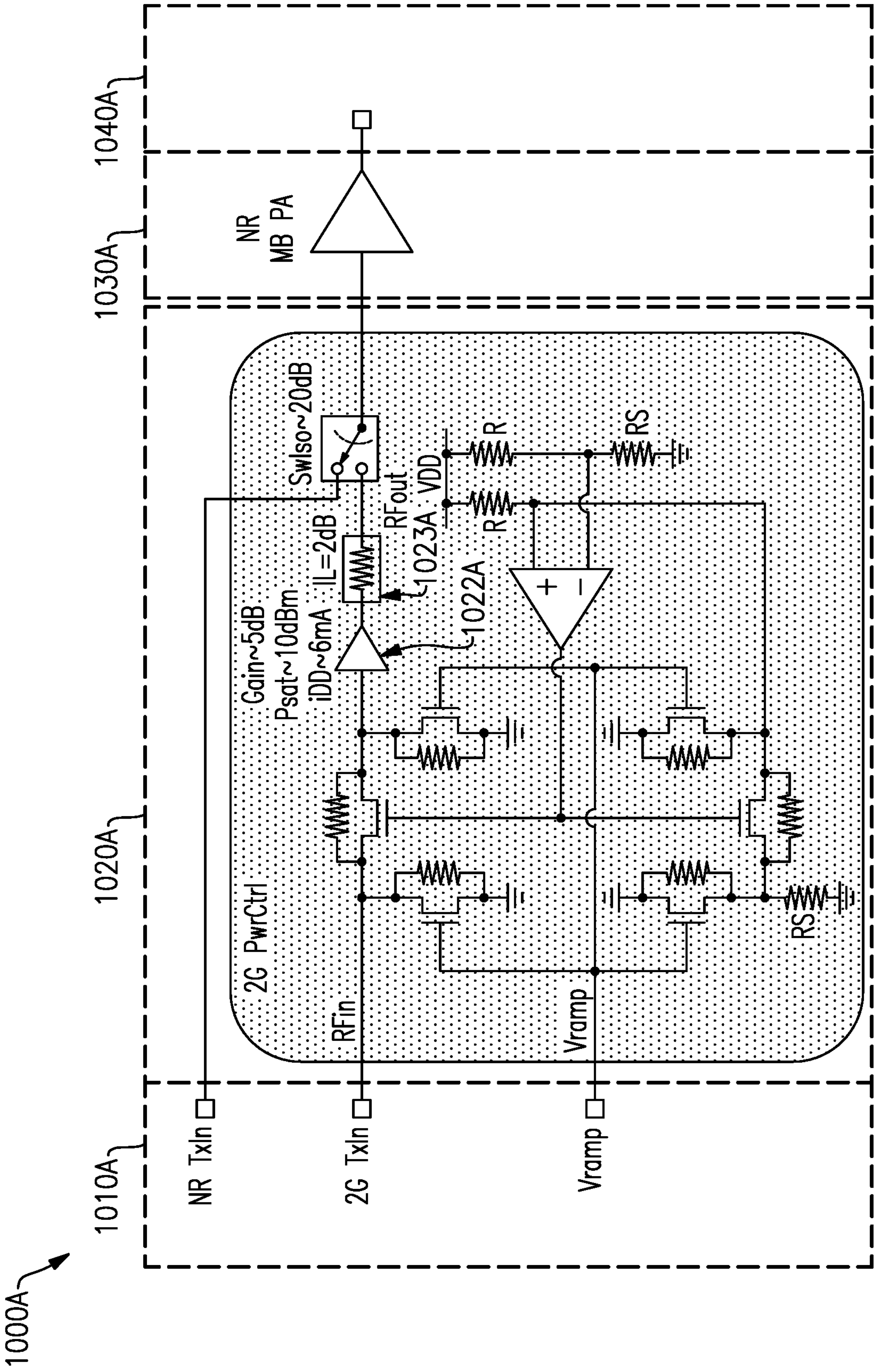
FIG. 10A is a schematic diagram of exemplary 2G ramping circuitry enabling reuse of a new radio (NR) power amplifier in accordance with an embodiment of the present invention.

FIG. 10A shows a schematic diagram of exemplary 2G ramping circuitry enabling reuse of a new radio (NR) power amplifier in accordance with an embodiment of the present invention. The ramping circuitry 1000A comprises a variable driver stage 1020A coupled between an input pin at 1010A and a NR PA 1030A. The variable driver stage 1020A comprises a voltage variable attenuator, a driver amplifier 1022A, and a pre-PA attenuator 1023A. The power amplifier 1030A may be coupled between the pre-PA attenuator 1023A and an output pin 1040A.

Figure 10B:
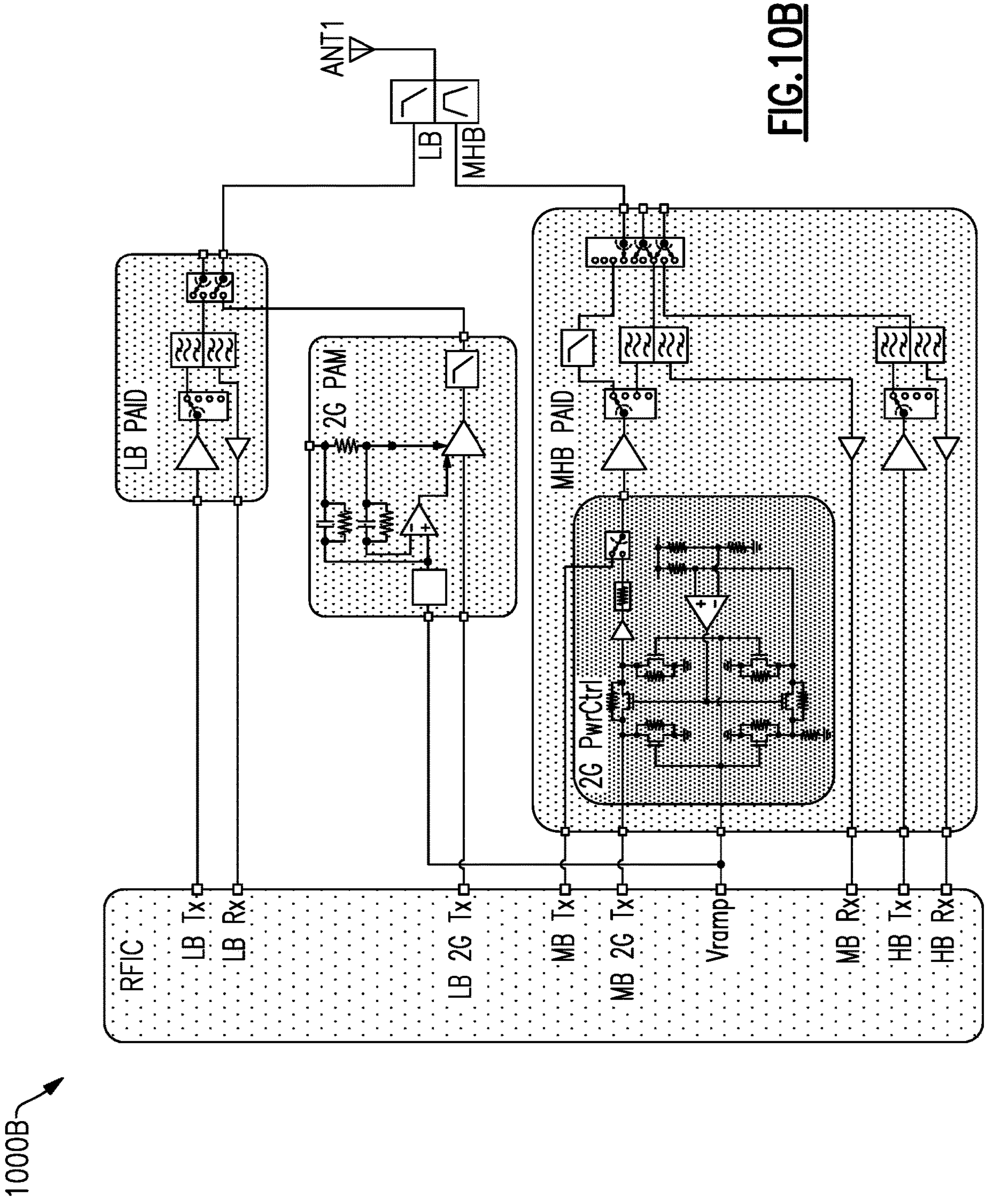
FIG. 10B is a schematic diagram of the exemplary 2G ramping circuitry of FIG. 10A integrated in an exemplary RF system enabling reuse of a new radio (NR) power amplifier in accordance with an embodiment of the present invention.

FIG. 10B is a schematic diagram of the exemplary 2G ramping circuitry of FIG. 10A integrated in an exemplary RF system enabling reuse of a new radio NR mid-band (MB) PA in accordance with an embodiment of the present invention. The ramping circuitry may be combined with the RF systems shown in FIG. 5 or FIG. 6 as exemplarily illustrated in FIG. 10B.

Figure 10C:
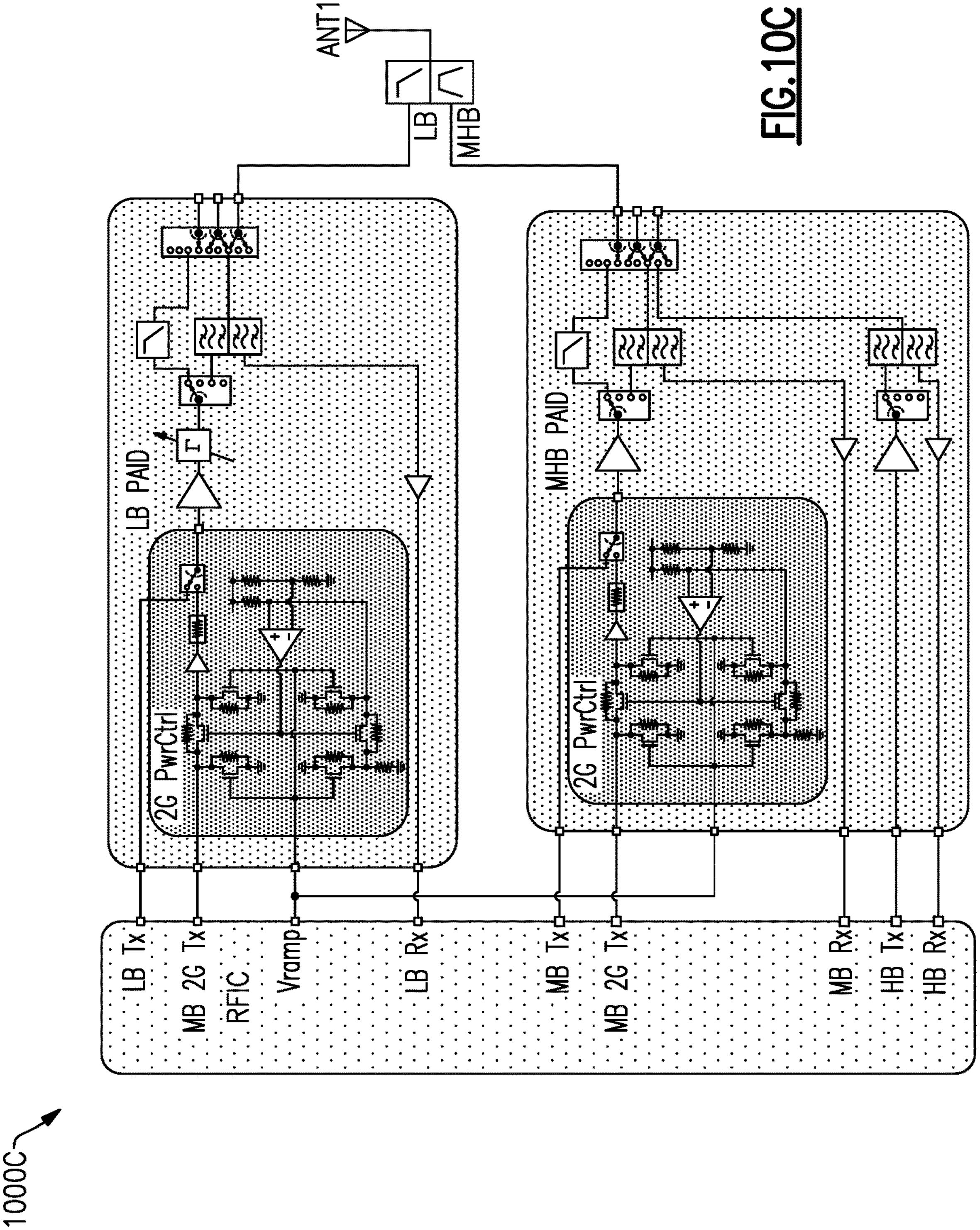
FIG. 10C is a schematic diagram of the exemplary 2G ramping circuitry of FIG. 10A integrated twice in an exemplary RF system enabling reuse of new radio (NR) power amplifiers in accordance with an embodiment of the present invention.

FIG. 10C is a schematic diagram of the exemplary 2G ramping circuitry of FIG. 10A integrated twice in an exemplary RF system enabling reuse of a NR low-band (LB) power amplifier 1030A and a NR MB PA each comprising a variable driver stage coupled between an input pin and the respective NR PA. Each variable driver stage may comprise a voltage variable attenuator, a driver amplifier, and a pre-PA attenuator. The respective power amplifier may be coupled between the respective pre-PA attenuator and a respective output pin. The ramping circuitry may be combined with the RF systems shown in FIG. 5 or FIG. 6 as exemplarily illustrated in FIG. 10C.

Figure 11A:
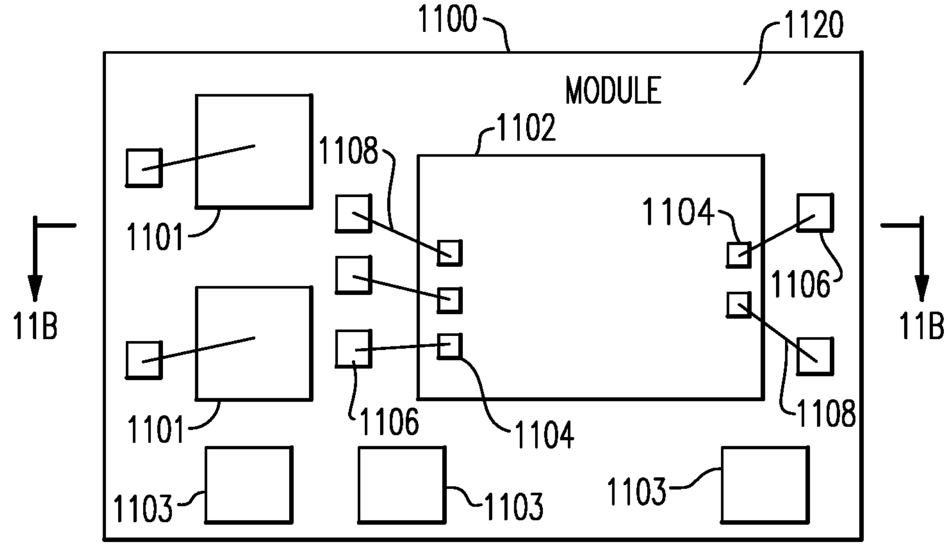
FIG. 11A is a schematic diagram of an exemplary packaged module.
Figure 11B:
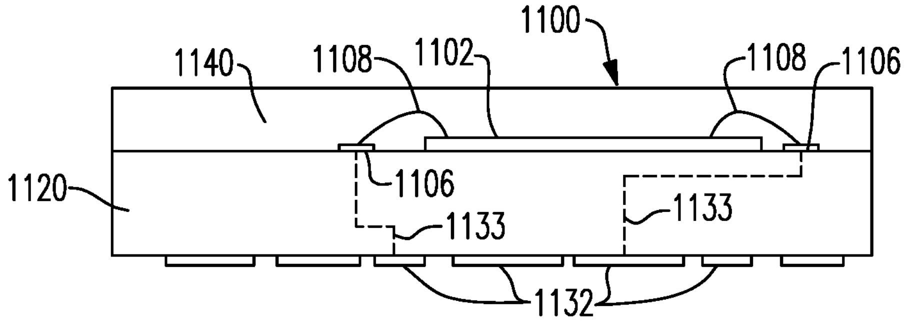
FIG. 11B is a schematic diagram of a cross-section of the exemplary packaged module of FIG. 11A taken along the line 11B-11B.

FIG. 11A is a schematic diagram of one embodiment of a packaged module 1100. FIG. 11B is a schematic diagram of a cross-section of the packaged module 1100 of FIG. 11A taken along the lines 11B-11B.

The RFFE systems herein can include one or more packaged modules, such as the packaged module 1100. Although the packaged module 1100 of FIGS. 11A-11B illustrates one example implementation of a module suitable for use in a RFFE system, the teachings herein are applicable to modules implemented in other ways.

The packaged module 1100 includes radio frequency components 1101, a semiconductor die 1102, surface mount devices 1103, wirebonds 1108, a package substrate 1120, and encapsulation structure 1140. The package substrate 1120 includes pads 1106 formed from conductors disposed therein. Additionally, the semiconductor die 1102 includes pins or pads 1104, and the wirebonds 1108 have been used to connect the pads 1104 of the die 1102 to the pads 1106 of the package substrate 1120.

As shown in FIG. 11B, the packaged module 1100 is shown to include a plurality of contact pads 1132 disposed on the side of the packaged module 1100 opposite the side used to mount the semiconductor die 1102. Configuring the packaged module 1100 in this manner can aid in connecting the packaged module 1100 to a circuit board, such as a phone board of a wireless device. The example contact pads 1132 can be configured to provide radio frequency signals, bias signals, and/or power (for example, a power supply voltage and ground) to the semiconductor die 1102. As shown in FIG. 11B, the electrical connections between the contact pads 1132 and the semiconductor die 1102 can be facilitated by connections 1133 through the package substrate 1120. The connections 1133 can represent electrical paths formed through the package substrate 1120, such as connections associated with vias and conductors of a multilayer laminated package substrate.

In some embodiments, the packaged module 1100 can also include one or more packaging structures to, for example, provide protection and/or facilitate handling. Such a packaging structure can include overmold or encapsulation structure 1140 formed over the packaging substrate 1120 and the components and die(s) disposed thereon.

It will be understood that although the packaged module 1100 is described in the context of electrical connections based on wirebonds, one or more features of the present disclosure can also be implemented in other packaging configurations, including, for example, flip-chip configurations.

Figure 12:
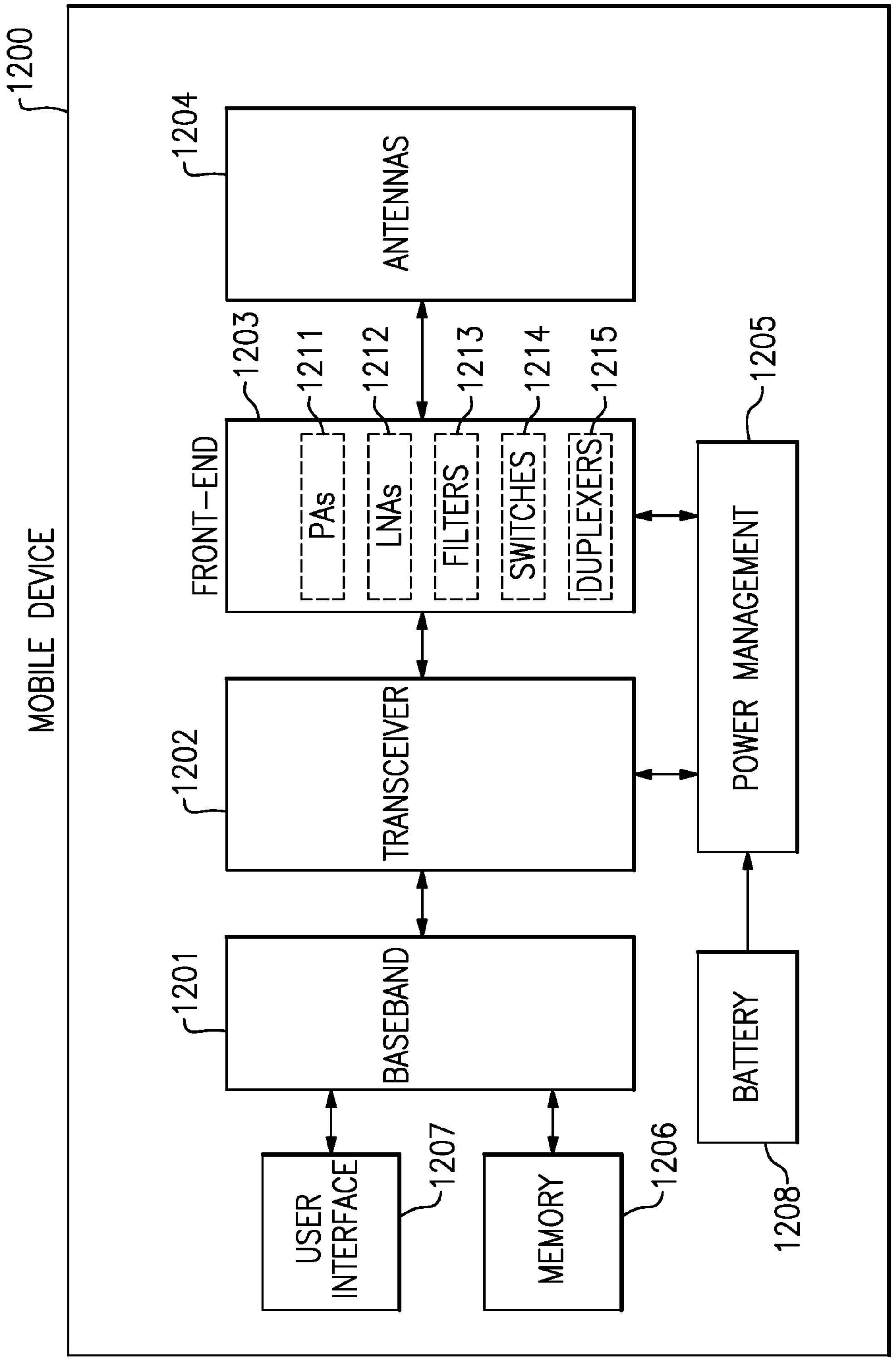
FIG. 12 is a schematic diagram of an exemplary mobile device.

FIG. 12 is a schematic diagram of one embodiment of a mobile device 1200. The mobile device 1200 includes a baseband system 1201, a transceiver 1202, a front-end system 1203, antennas 1204, a power management system 1205, a memory 1206, a user interface 1207, and a battery 1208.

The mobile device 1200 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 1202 generates RF signals for transmission and processes incoming RF signals received from the antennas 1204.

The front-end system 1203 aids in conditioning signals transmitted to and/or received from the antennas 1204. In the illustrated embodiment, the front-end system 1203 includes power amplifiers (PAS) 1211, low noise amplifiers (LNAs) 1212, filters 1213, switches 1214, and duplexers 1215. However, other implementations are possible.

For F example, the front-end system 1203 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1200 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1204 can include antennas used for a wide variety of types of communications. For example, the antennas 1204 can include antennas for transmitting and/or receiving signals associated with a wide variety of frequencies and communications standards.

In certain implementations, the antennas 1204 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1200 can operate with beamforming in certain implementations. For example, the front-end system 1203 can include phase shifters having variable phase controlled by the transceiver 1202. Additionally, the phase shifters are controlled to provide beam formation and directivity for transmission and/or reception of signals using the antennas 1204. For example, in the context of signal transmission, the phases of the transmit signals provided to the antennas 1204 are controlled such that radiated signals from the antennas 1204 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1204 from a particular direction. In certain implementations, the antennas 1204 include one or more arrays of antenna elements to enhance beamforming.

The baseband system 1201 is coupled to the user interface 1207 to facilitate processing of various user input and output (I/O), such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202. As shown in FIG. 12, the baseband system 1201 is coupled to the memory 1206 of facilitate operation of the mobile device 1200.

The memory 1206 can be used for a wide variety of purposes, such as storing data and/or instructions to facilitate the operation of the mobile device 1200 and/or to provide storage of user information.

The power management system 1205 provides a number of power management functions of the mobile device 1200. In certain implementations, the power management system 1205 includes a PA supply control circuit that controls the supply voltages of the power amplifiers 1211. For example, the power management system 1205 can be configured to change the supply voltage(s) provided to one or more of the power amplifiers 1211 to improve efficiency, such as power added efficiency (PAE).

As shown in FIG. 12, the power management system 1205 receives a battery voltage from the battery 1208. The battery 1208 can be any suitable battery for use in the mobile device 1200, including, for example, a lithium-ion battery.

The front-end system 1203 of FIG. 12 can be implemented in accordance with one or more features of the present disclosure. Although the mobile device 1200 illustrates one example of a RF communication device that can include a RFFE system implemented in accordance with the present disclosure, the teachings herein are applicable to a wide variety of RF electronics.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage including a switch configured to receive the $V_{ramp}$ control signal directly from a transceiver, and the variable driver stage further including a variable attenuator configured to receive the $V_{ramp}$ control signal directly from the switch.

2. The radio frequency front end system of claim 1 wherein the variable driver stage is configured to detect an envelope of the $V_{ramp}$ control signal to set the ramp profile.

3. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage including a variable attenuator configured to establish the ramp profile at the power amplifier.

4. The radio frequency front end system of claim 3 wherein the variable driver stage is configured to bypass the variable attenuator to directly amplify with the power amplifier for second generation (2G) cellular communications.

5. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage including a driver amplifier configured to reconstruct the ramp profile from VCC variation.

6. The radio frequency front end system of claim 5 wherein the variable driver stage includes a fixed attenuator coupled between the driver amplifier and the power amplifier.

7. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage configured to apply the ramp profile to the power amplifier according to the $V_{ramp}$ control signal, and configured to apply the linear ramp by setting the gain to the fixed target value, without envelope detection.

8. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage including a driver amplifier coupled between an input pin for 2G cellular communications and the power amplifier, the variable driver stage including a switch coupled to an output of the driver amplifier, an input pin for 4G or 5G cellular communications, and the power amplifier.

9. A radio frequency front end system comprising:

a power amplifier; and a variable driver stage coupled to the power amplifier, the variable driver stage configured to apply a ramp profile to the power amplifier according to a $V_{ramp}$ control signal, and configured to apply a linear ramp by setting a gain to a fixed target value, the variable driver stage including a voltage variable attenuator, a driver amplifier, and a pre-power amplifier attenuator.

10. The radio frequency front end system of claim 9 wherein the power amplifier is a low-band (LB) power amplifier for 4G or 5G cellular communications.

11. The radio frequency front end system of claim 9 wherein the power amplifier is a mid-band (MB) power amplifier for 4G or 5G cellular communications.

12. The radio frequency front end system of claim 10 further comprising:

a mid-band power amplifier for 4G or 5G cellular communications; and a variable driver stage coupled to the mid-band power amplifier, the variable driver stage being coupled to the mid-band power amplifier configured to apply a ramp profile to the mid-band power amplifier according to a $V_{ramp}$ control signal, and configured to apply a linear ramp by setting a gain to a fixed target value.

13. The radio frequency front end system of claim 1 wherein the variable driver stage is coupled between an input pin for 2G cellular communications and the power amplifier.

14. The radio frequency front end system of claim 3 wherein the variable driver stage is coupled between an input pin for 2G cellular communications and the power amplifier and is configured to process a 2G transmit signal received on the input pin.

15. The radio frequency front end system of claim 14 wherein the variable driver stage includes a switch configured to selectively provide to the power amplifier either the processed 2G transmit signal or a second transmit signal received on a second input pin.

16. The radio frequency front end system of claim 15 wherein second transmit signal is a New Radio (NR) transmit signal.

17. The radio frequency front end system of claim 5 wherein the variable driver stage is coupled between an input pin for 2G cellular communications and the power amplifier.

18. The radio frequency front end system of claim 9 wherein the variable driver stage is coupled between an input pin for 2G cellular communications and the power amplifier.

19. A mobile device including the radio frequency front end system of claim 1.

20. A mobile device including the radio frequency front end system of claim 3.

* * * * *